United States Patent
Baldwin et al.

(10) Patent No.: US 9,237,665 B1
(45) Date of Patent: Jan. 12, 2016

(54) ELECTRICAL BOX

(71) Applicants: Jeffrey Baldwin, Desert Hills, AZ (US); John Klein, Gilbert, AZ (US); Ryan Liebengood, Gilbert, AZ (US)

(72) Inventors: Jeffrey Baldwin, Desert Hills, AZ (US); John Klein, Gilbert, AZ (US); Ryan Liebengood, Gilbert, AZ (US)

( * ) Notice: Subject to any disclaimer, the term of this patent is extended or adjusted under 35 U.S.C. 154(b) by 35 days.

(21) Appl. No.: 14/095,668

(22) Filed: Dec. 3, 2013

Related U.S. Application Data

(60) Provisional application No. 61/807,759, filed on Apr. 3, 2013.

(51) Int. Cl.
*H02G 3/08* (2006.01)
*H05K 5/02* (2006.01)
*F16M 13/02* (2006.01)

(52) U.S. Cl.
CPC ............ *H05K 5/0217* (2013.01); *F16M 13/027* (2013.01)

(58) Field of Classification Search
CPC .......... H02G 3/086; H02G 3/08; H02G 3/18; H02G 3/20; H02G 3/126; H02G 3/085; F21V 21/02; F21V 21/03
USPC ............ 174/50, 54, 58, 61–63; 248/343, 906; 220/3.2, 3.3, 3.9, 3.5, 3.6
See application file for complete search history.

(56) References Cited

U.S. PATENT DOCUMENTS

| | | | |
|---|---|---|---|
| 4,012,580 A * | 3/1977 | Arnold | ............................ 174/53 |
| 5,857,581 A | 1/1999 | Jorgensen | |
| 5,860,548 A | 1/1999 | Kerr, Jr. | |
| 5,883,331 A | 3/1999 | Reiker | |
| 5,900,583 A | 5/1999 | Russo | |
| 5,907,124 A | 5/1999 | Reiker | |
| 5,950,853 A | 9/1999 | Jorgensen | |
| 5,965,845 A | 10/1999 | Reiker | |
| 5,988,421 A | 11/1999 | Jorgensen | |
| 6,291,768 B1 * | 9/2001 | Reiker | ............................ 174/62 |
| 6,545,216 B1 | 4/2003 | Bell | |
| 6,720,496 B1 | 4/2004 | Weeks | |
| 7,148,420 B1 | 12/2006 | Johnson | |
| 7,191,994 B2 | 3/2007 | Johnson | |
| 7,381,893 B2 | 6/2008 | Kerr, Jr. | |
| 7,456,366 B2 | 11/2008 | Makwinski | |
| 7,837,172 B2 | 11/2010 | Johnson | |
| 8,097,806 B2 | 1/2012 | Lalancette | |

* cited by examiner

*Primary Examiner* — Angel R Estrada
*Assistant Examiner* — Dimary Lopez Cruz
(74) *Attorney, Agent, or Firm* — Ryan Liebengood

(57) ABSTRACT

A electrical box including a top wall, a side wall connected to the top wall, a cavity formed by the top wall and the side wall, at least one mounting flange on the side wall having a mounting hole therein, at least one mounting fastener in communication with the at least one mounting flange, and wherein the mounting fastener is slidably engaged with the at least one mounting flange.

21 Claims, 27 Drawing Sheets

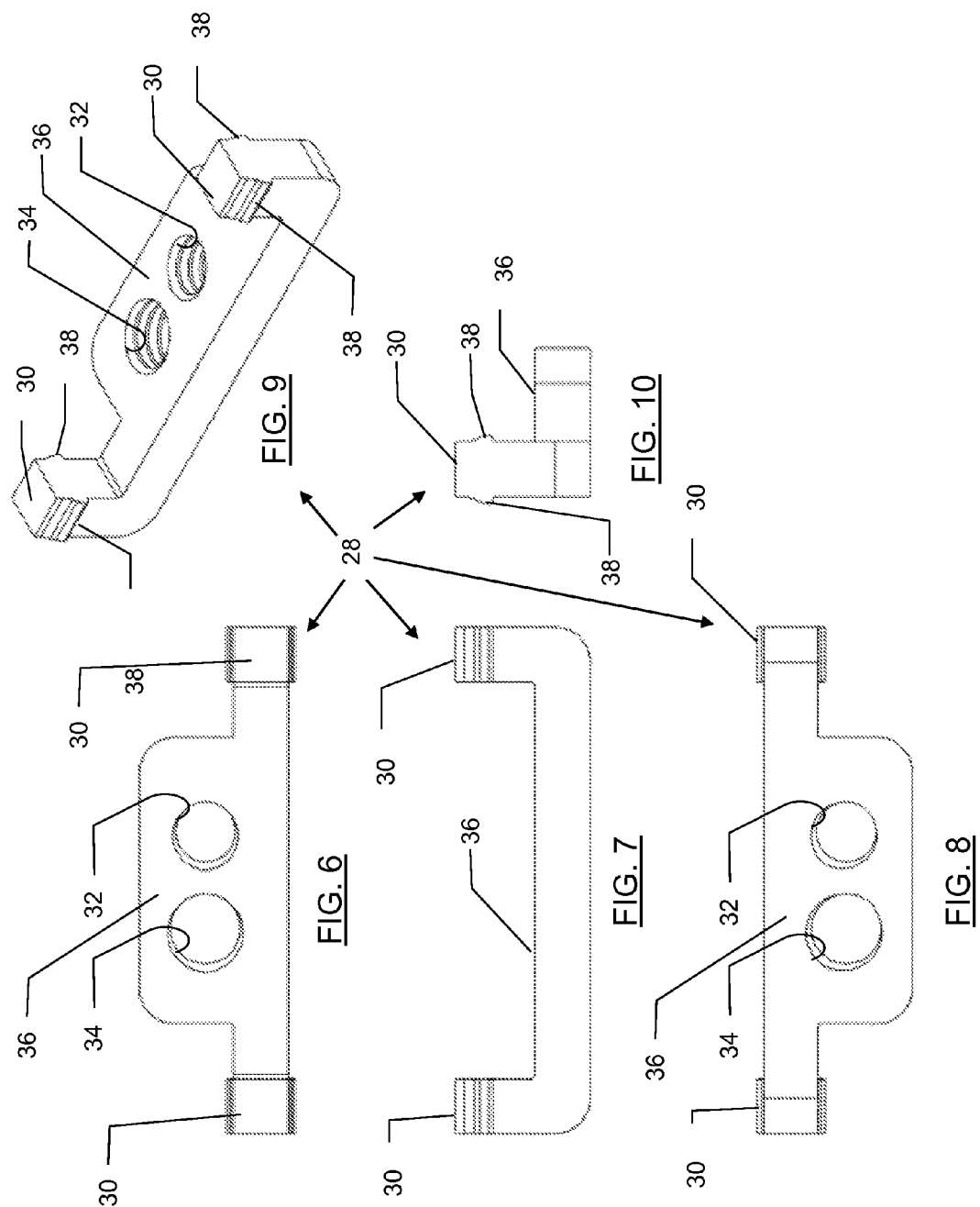

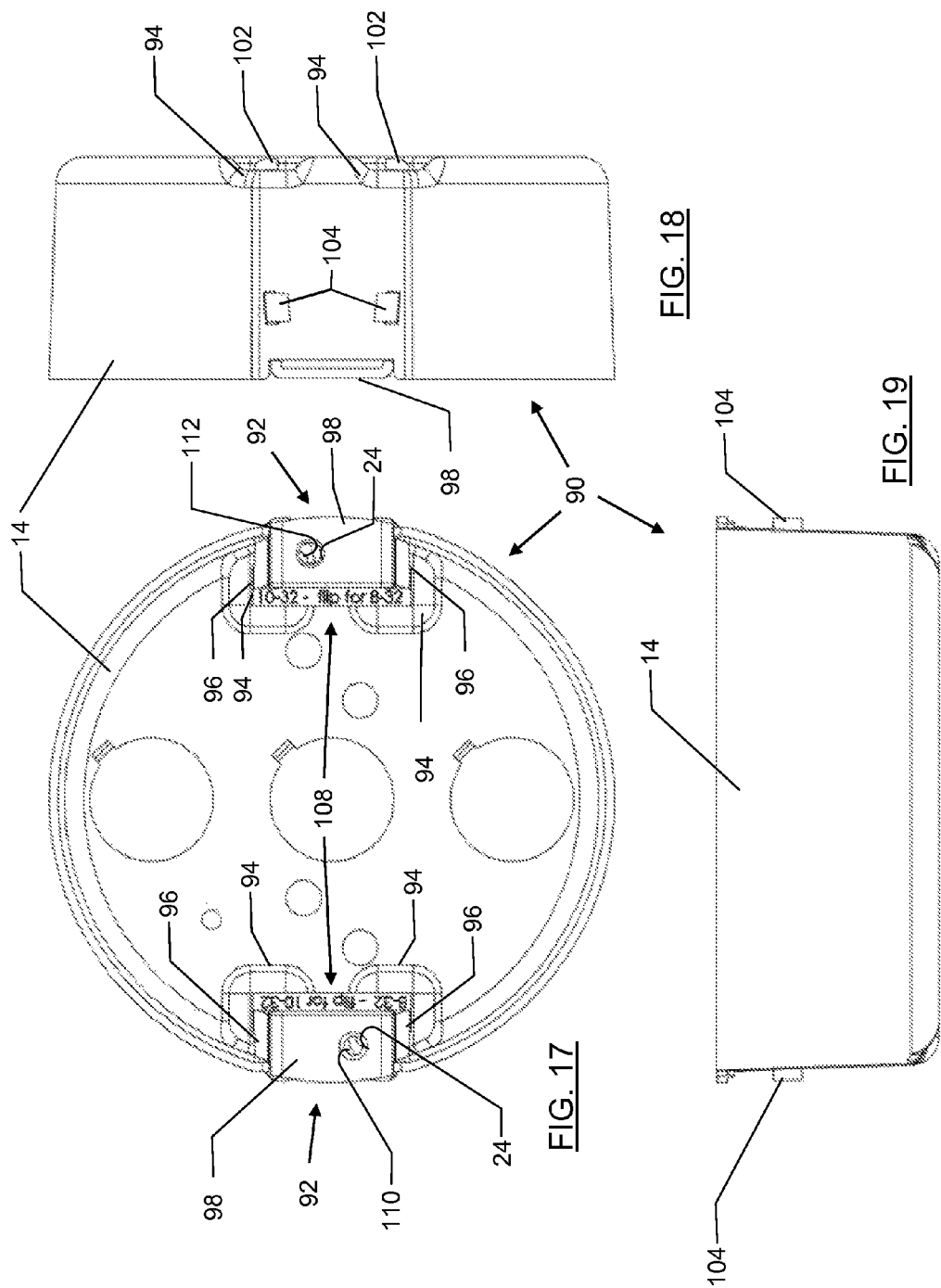

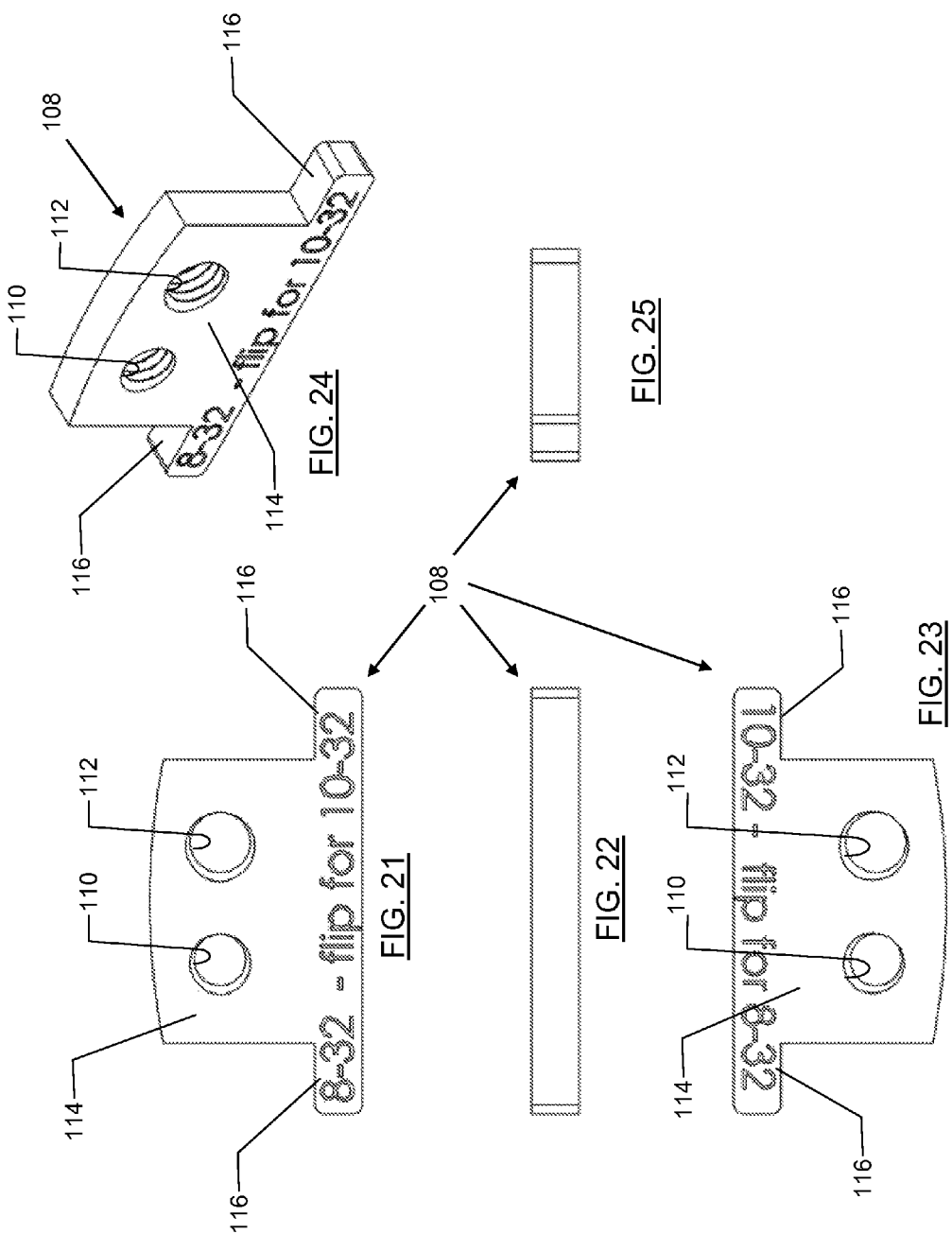

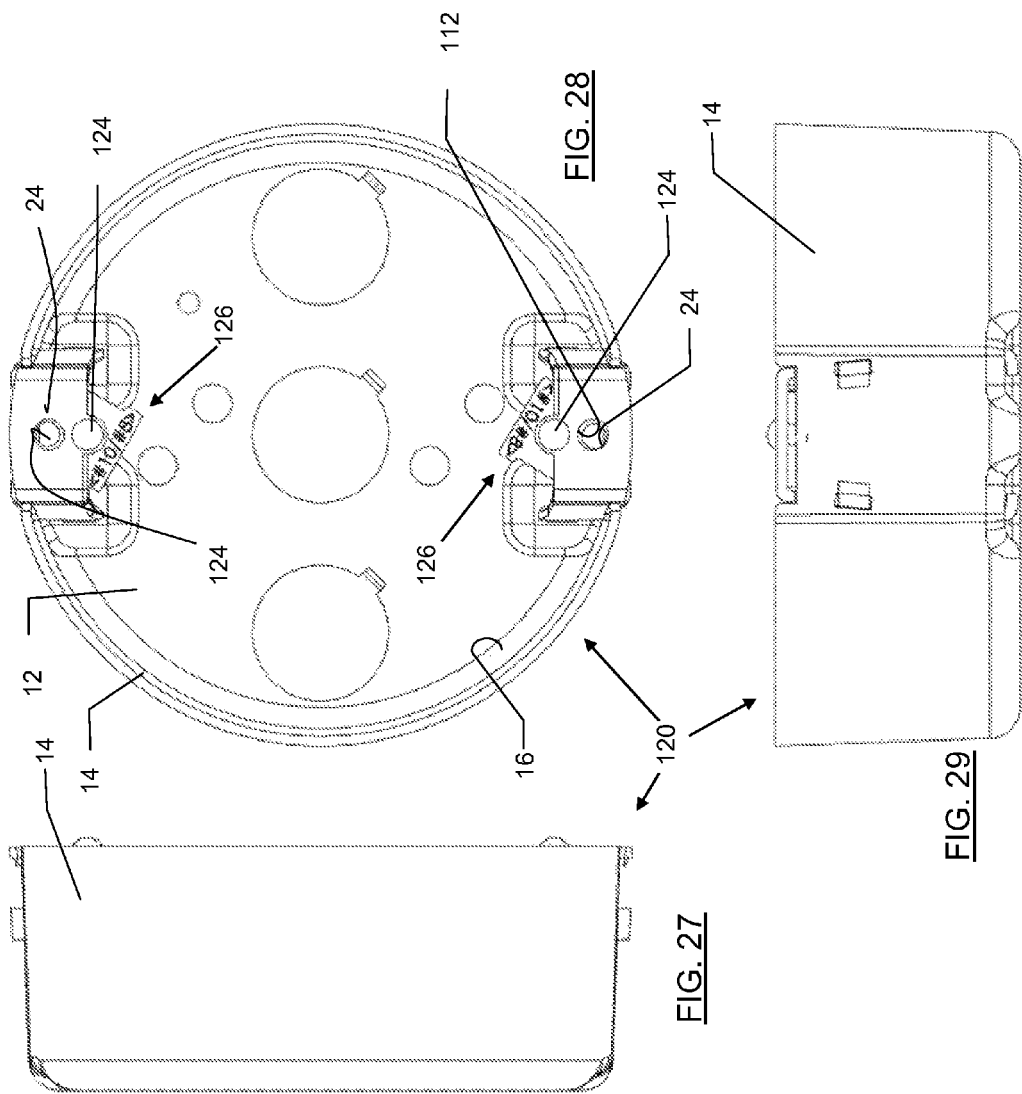

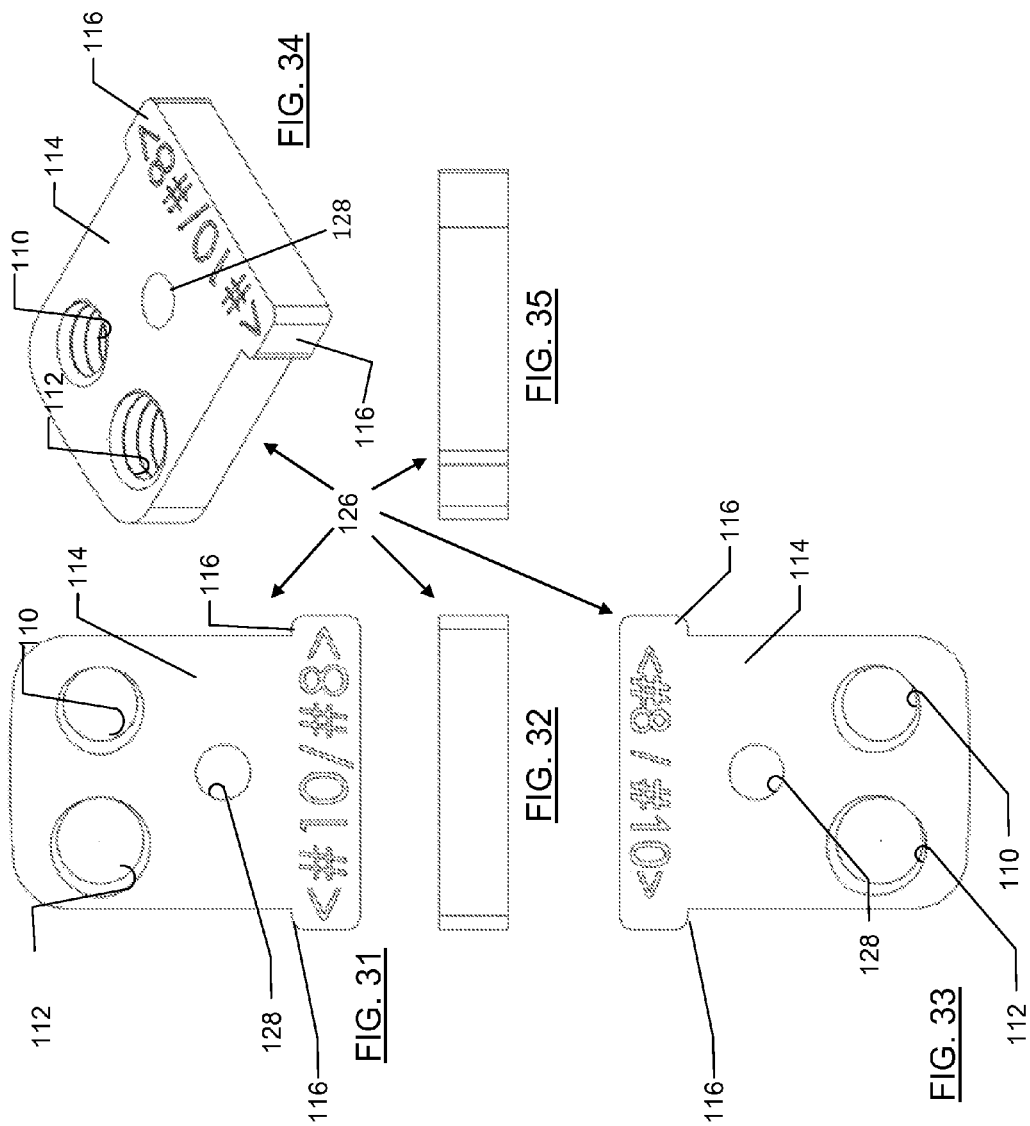

ELECTRICAL BOX

CROSS-REFERENCE TO RELATED APPLICATION

This application claims priority to U.S. Provisional Patent Application No. 61/807,759, filed on Apr. 3, 2013, and the disclosure of which is hereby incorporated herein by reference.

BACKGROUND

1. Technical Field

Aspects of the present disclosure relate generally to electrical boxes and more specifically to electrical boxes for supporting light fixtures and/or ceiling fans from a ceiling.

2. Background Art

Electrical boxes are well known and have been used for decades in buildings. Electrical boxes are used both in walls and ceilings to provide electrical current to various places within a building. Further, the electrical boxes may also be used to mount various electrical receptacles, such as duplex or decorator outlets, or electrical switches. In ceilings, electrical boxes function to support the weight of the light fixture or ceiling fan in addition to providing electrical current to operate the light and/or fan.

Electrical boxes, and specifically ceiling fan boxes, can be installed in a number of different ways. In new construction, the electrical boxes are mounted directly to studs or trusses and then drywall is mounted. In retrofit applications, the electrical box is mounted to drywall instead of the studs. In ceiling fan box retrofit installations the ceiling fan box must be mounted to the studs or other suitable structure so that the ceiling fan weight may be properly supported during fan operation.

SUMMARY

Aspects of this disclosure relate to electrical boxes. In one aspect, an electrical box includes a top wall, a side wall connected to the top wall, a cavity formed by the top wall and the side wall, at least one mounting flange on the side wall having a mounting hole therein, at least one mounting fastener in communication with the at least one mounting flange, and wherein the mounting fastener is slidably engaged with the at least one mounting flange.

In an implementation, the at least on mounting flange may further include two mounting flanges positioned 180 degrees from each other with at least one mounting fastener in communication with each of the two mounting flanges. The at least one mounting flange may be external to the cavity. The at least one mounting flange may be connected to the side wall. The mounting fastener may further include a first threaded opening and a second threaded opening. The first threaded opening may be a different diameter or thread pitch than the second threaded opening. The first threaded opening may be accessible through the at least one mounting flange when the mounting fastener is in a first position and the second threaded opening may accessible through the at least one mounting flange when the mounting fastener is in a second position.

The mounting fastener may include at least one sliding tab. The at least one sliding tab may extend through the at least one mounting flange. The electrical box may further include a secondary mounting flange positioned below the at least one mounting flange The at least one mounting flange may extend away from the cavity in a direction generally parallel to the top wall.

In another aspect, an electrical box includes a top wall, a side wall connected to the top wall, a cavity formed by the top wall and the side wall, at least one mounting flange positioned at least partially within the cavity and having no more than one mounting hole, at least one mounting fastener in communication with the at least one mounting flange and positionable in alignment with the mounting hole, and wherein the at least one mounting fastener is movably engaged with the at least one mounting flange.

In an implementation, the mounting fastener may be oriented in a first orientation to provide a first threaded opening and the mounting fastener may be oriented in a second orientation to provide a second threaded opening different from the first threaded opening. The first orientation may be 180 degrees from the second orientation. The at least one mounting fastener may be rotatably mounted to the at least one mounting flange. The at least one mounting fastener may rotate about an axis generally perpendicular to a plane of the top wall. The mounting fastener may provide a first threaded opening of a first size or thread when the mounting fastener is rotated in a first direction and the mounting fastener may provides a second threaded opening of a second size or thread when the mounting fastener is rotated in a second direction opposite the first direction. The electrical box may include a guard to prevent access to an interior portion of the mounting flange.

In another aspect, a ceiling electrical box brace includes an outer rod having a first end and a second end and an electrical box being connectable to the rod, an inner rod being movable within the outer rod for increasing or decreasing an overall length of a combined inner and outer rod, at least one engagement member positioned on one of the outer rod or the inner rod and having a first mounting tooth and a second mounting tooth.

In an implementation, The first mounting tooth may engage ceiling brace before the second mounting tooth. The first mounting tooth may include an angled hook portion and the second mounting tooth may be generally straight.

Aspects and applications of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Embodiments of the present invention will hereinafter be described in conjunction with the appended drawings, where like designations denote like elements, and:

FIG. 6 is a bottom view of the first aspect ceiling fan box mounting screw.
FIG. 7 is a side view of the first aspect ceiling fan box mounting screw.
FIG. 8 is a top view of the first aspect ceiling fan box mounting screw.
FIG. 9 is a perspective view of the first aspect ceiling fan box mounting screw.
FIG. 10 is a side view of the first aspect ceiling fan box mounting screw.
FIG. 17 is a bottom view of the fourth aspect ceiling fan box.
FIG. 18 is a side view of the fourth aspect ceiling fan box.
FIG. 19 is a side view of the fourth aspect ceiling fan box.
FIG. 21 is a top view of a mounting fastener.
FIG. 22 is a side view of the mounting fastener.
FIG. 23 is a bottom view of the mounting fastener.
FIG. 24 is a perspective view of the mounting fastener.
FIG. 25 is a side view of the mounting fastener.
FIG. 27 is a side view of the fifth aspect ceiling fan box.
FIG. 28 is a bottom view of the fifth aspect ceiling fan box.
FIG. 29 is a side view of the fifth aspect ceiling fan box.
FIG. 31 is a top view of a mounting fastener.
FIG. 32 is a side view of the mounting fastener.
FIG. 33 is a bottom view of the mounting fastener.
FIG. 34 is a perspective view of the mounting fastener.
FIG. 35 is a side view of the mounting fastener.

DETAILED DESCRIPTION

This disclosure, its aspects and implementations, are not limited to the specific components or assembly procedures disclosed herein. Many additional components and assembly procedures known in the art consistent with the intended operation and assembly procedures for an electrical box will become apparent for use with implementations of an electrical box from this disclosure. Accordingly, for example, although particular components are disclosed, such components and other implementing components may comprise any shape, size, style, type, model, version, measurement, concentration, material, quantity, and/or the like as is known in the art for such implementing components, consistent with the intended operation of an electrical box.

Figure 1:
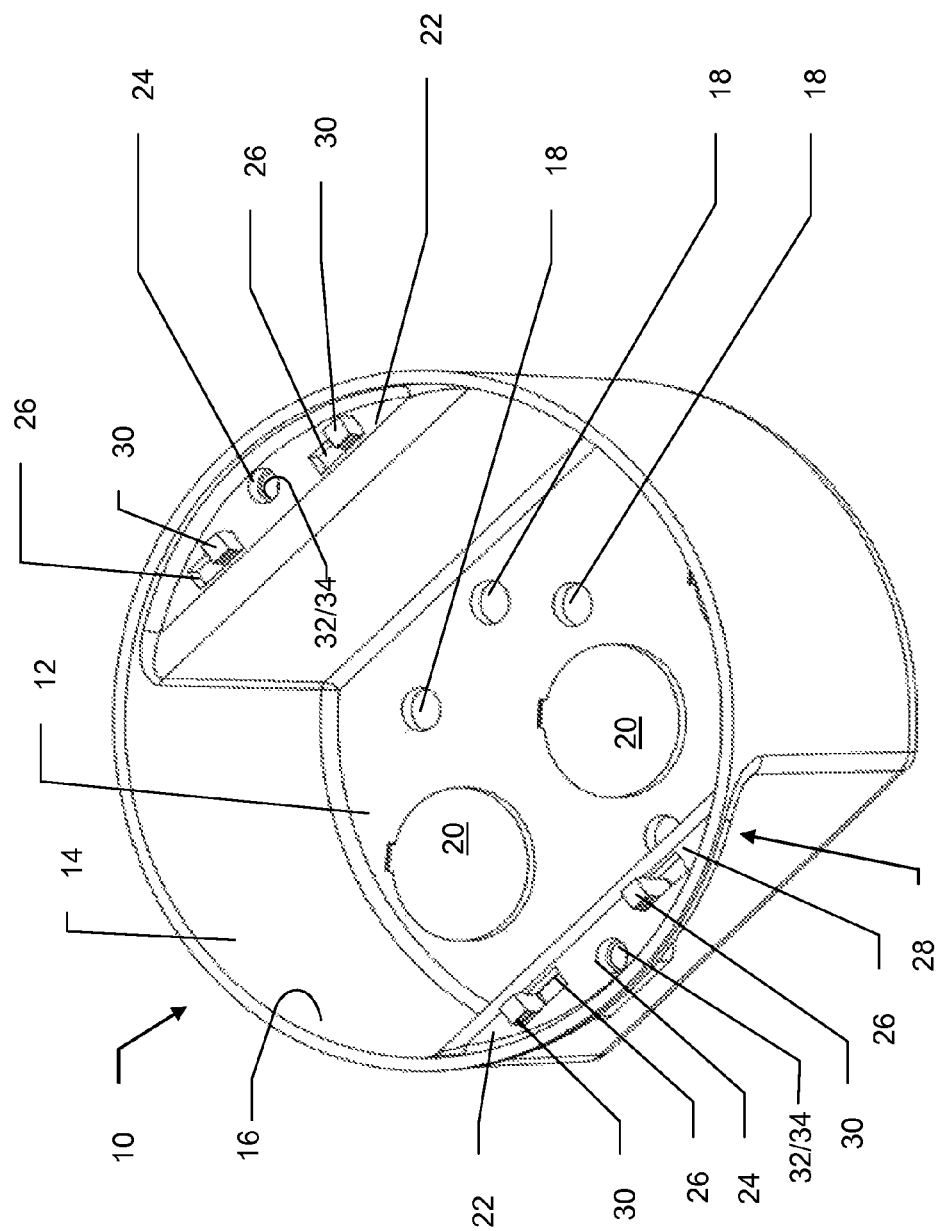
FIG. 1 is a perspective view of a first aspect ceiling fan box.
Figure 2:
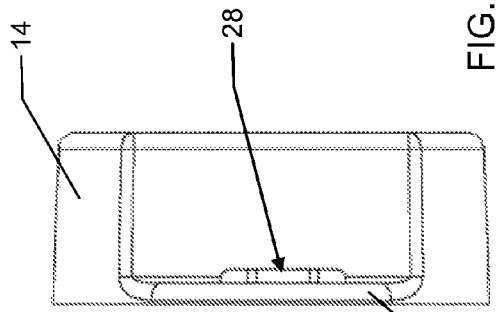
FIG. 2 is a bottom view of the first aspect ceiling fan box.
Figure 3:
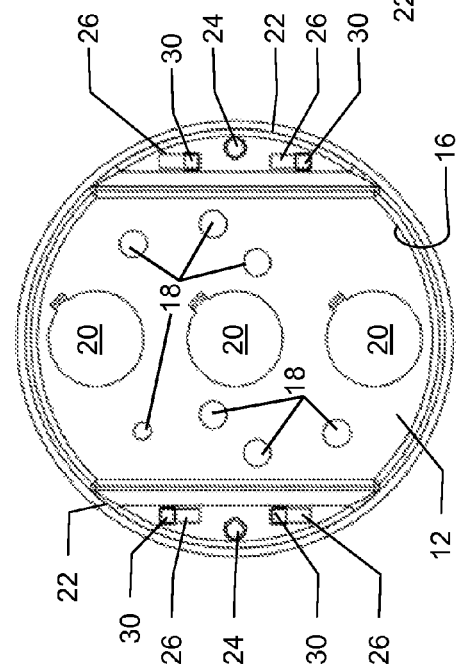
FIG. 3 is a side view of the first aspect ceiling fan box.
Figure 4:
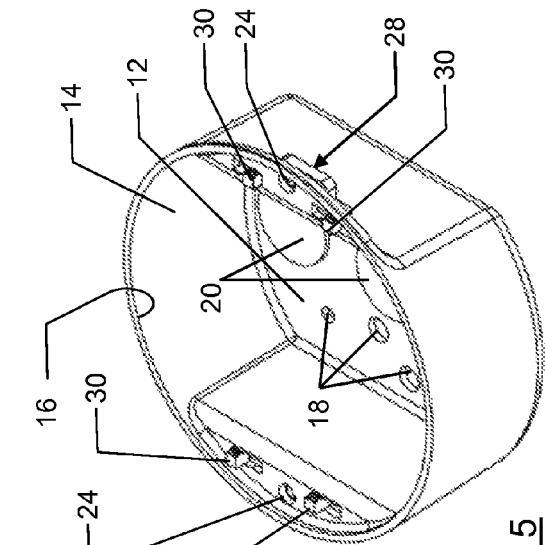
FIG. 4 is a side view of the first aspect ceiling fan box.
Figure 5:
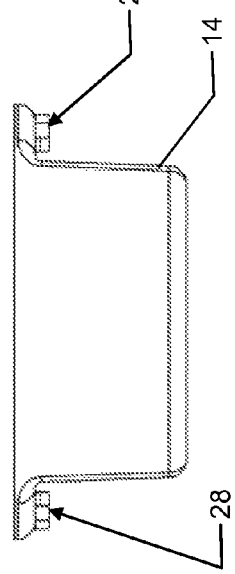
FIG. 5 is a perspective view of the first aspect ceiling fan box.

FIGS. 1 though 10 illustrate various views and components of a first aspect electrical box 10. Each of the electrical boxes shown and described herein may be utilized in any suitable location within a building, including but not limited to within the ceiling. Certain building code requirements mandate that when an electrical box is used in a ceiling certain strength and load bearing requirements must be met. It is within the spirit and scope of the present disclosure that all such electrical boxes shown and described would meet all current code requirements.

FIGS. 1 though 5 illustrate assembled views of electrical box 10 having a top wall 12 and a side wall 14 connected to top wall 12 and extending generally perpendicularly there from. Top wall 12 and side wall 14 together define a cavity 16 arranged to receive electrical wiring and fasteners for securing the electrical box to the building in some cases. Top wall 12 may also include a plurality of holes 18 for receiving electrical box mounting fasteners, while covers 20 provide holes which may be removed to provide openings for electrical wires and cables to enter the cavity 16.

Side wall 14 includes a pair of mounting flanges 22 positioned 180 degrees from each other and extending generally away from cavity 16 in a direction generally parallel to top wall 12. Mounting flanges 22 may include a mounting hole 24 and slots 26. In one implementation, only a single mounting hole 24 is utilized, while in another implementation multiple mounting holes are utilized and envisioned. Each mounting flanges 22 and slots 26 cooperate to receive a mounting fastener 28 which may be positioned on a top side or a bottom side of mounting flange 22. Each mounting fastener 28 includes sliding tabs 30 and threaded openings 32 and 34 as will be discussed in greater detail below.

Referring now to FIGS. 6 through 10, various views of mounting fastener 28 are shown in more detail. Mounting fastener 28 includes a body 36 with threaded opening 32 and threaded opening 34 therein, with sliding tabs 30 extending away from end portions of body 36. Threaded opening 32 may be arranged to receive an 8-32 screw, while threaded opening 34 may be arranged to receive a 10-32 screw. While 8-32 and 10-32 are relatively common sizes and thread pitches of screws and bolts, it is within the spirit and scope of the present disclosure to provide any suitable size and thread pitch in threaded openings 32 and 34 as may be necessary. Mounting fasteners 28 may also includes locking portions 38 which prevent the mounting fasteners from being pulled back through slots 26 once the mounting fasteners are installed in the mounting flanges. Nevertheless, the locking portions 38 still permit the mounting fasteners to slide within slots 26 by pushing or pulling on mounting tabs 30.

Advantageously, mounting fastener 28 may be designed such that threaded opening 32 is accessible through mounting hole 24 when the mounting fastener is slide completely to one direction and threaded opening 34 is accessible through mounting hole 24 when the mounting fastener is slide completely to the opposite direction. This arrangement allows a user to selectively slide the mounting fastener within the mounting flange and obtain the appropriate threaded opening through mounting hole 24. In still other implementations, the threaded openings 32 and 34 are not positioned at extreme locations on mounting fastener 28 such that the mounting fastener may incorporate 3, 4, or more different threaded opening sizes and/or thread pitches. Further, the user may receive various different mounting flanges 28 having different threaded pitches and sizes to fit custom applications.

Thus it is seen that the slidable mounting fasteners positioned within mounting flanges provides a simple to operate and electrical box which may receive any number of suitable fasteners for mounting an electrical box or ceiling fan without the possibility of accidentally misaligning the fixture in the wrong threaded openings. Another advantage can be seen in that the user may remove the light fixture or ceiling fan and replace it with a different fixture type without having to remove the electrical box and replacing it with another model. The user can simple slide the mounting tabs to any of the other setting to fit other thread pitches and thread diameters.

Figure 11:
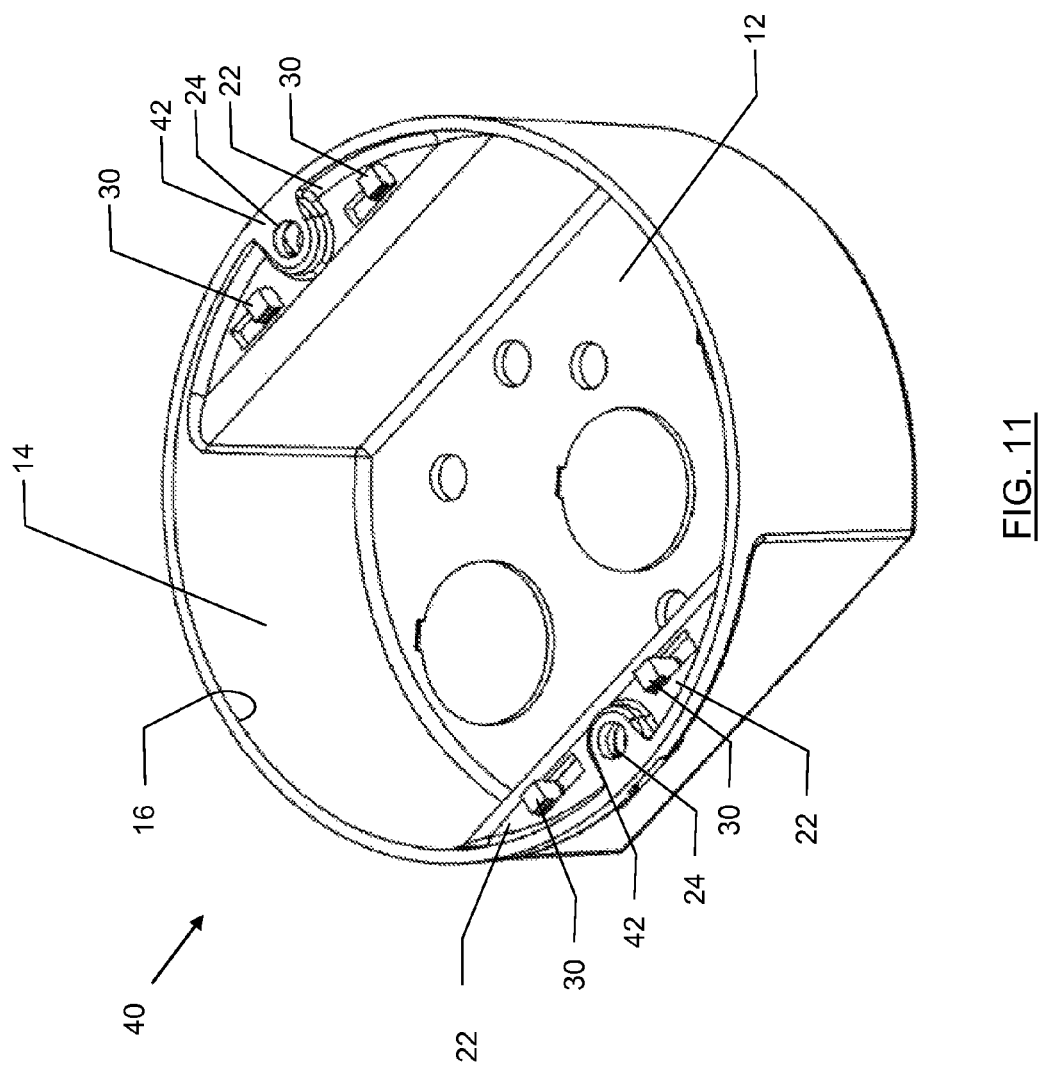
FIG. 11 is a perspective view of a second aspect ceiling fan box.

FIG. 11 illustrates a second aspect electrical box 40 having features and components similar to electrical box 10 with one additional component, a secondary mounting flange 42. Secondary mounting flange 42 may be incorporated to further strengthen and provide additional support to mounting flange 22 and mounting hole 24. Specifically, ceiling fans and other heavy fixtures may require additional support to prevent deforming the mounting flanges and causing injury. Secondary mounting flange 42 is positioned below mounting hole 24 and mounting flange 22 and may extend from a perimeter of the mounting flange 22 inwards until extending beyond mounting hole 24. Advantageously, this allows the secondary mounting flange 42 to provide additional support without impairing or impacting the movement of mounting fastener 28. Accordingly, the second aspect electrical box 40 provides the same features as electrical box 10 with additional support structure.

Figure 12:
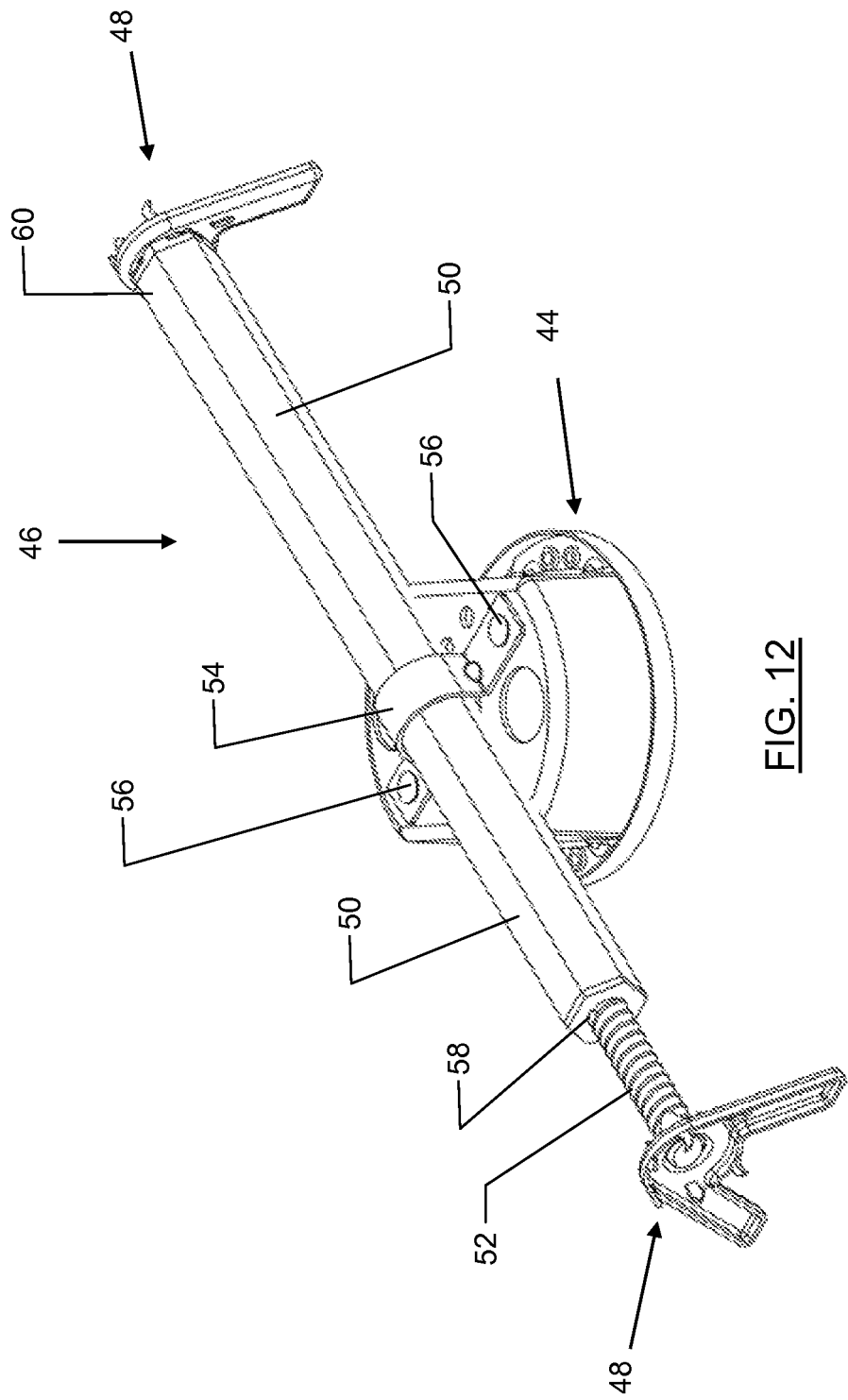
FIG. 12 is a perspective view of a ceiling fan box secured to a ceiling fan brace.
Figure 13:
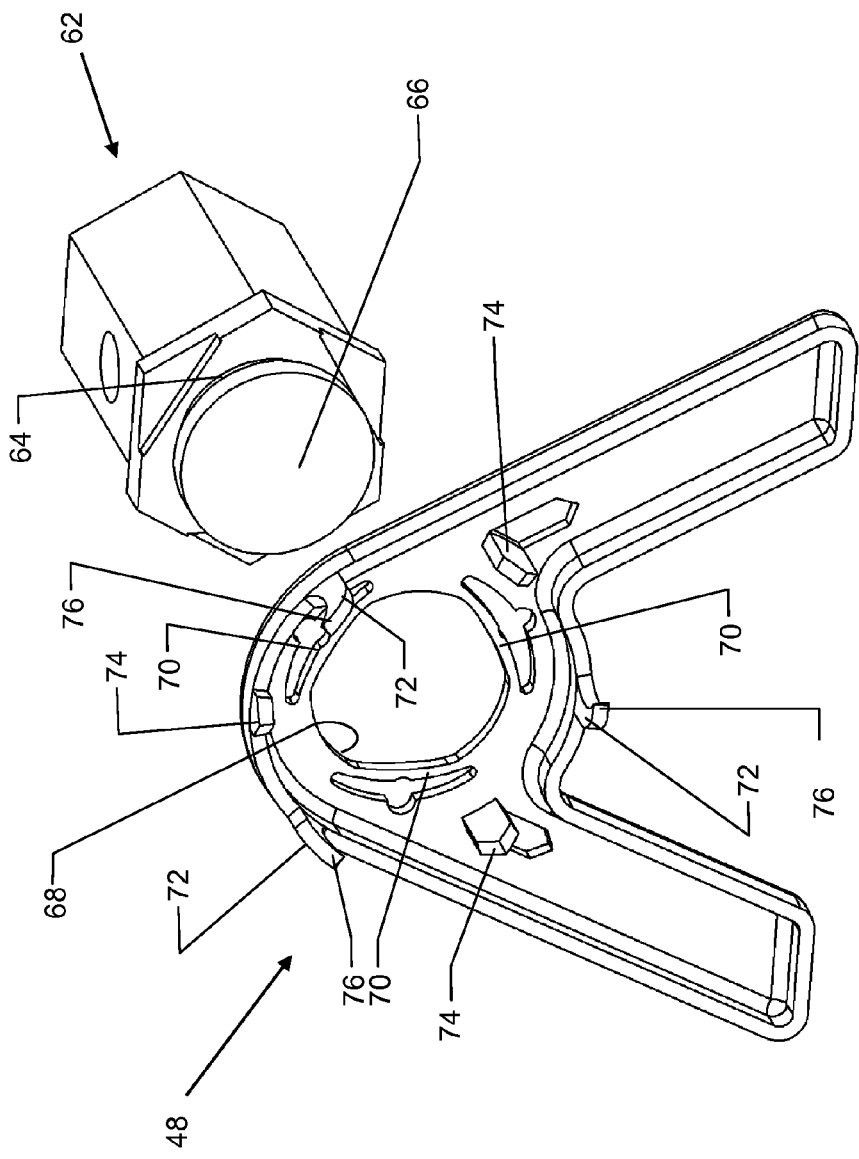
FIG. 13 is a perspective view of a mounting component of the ceiling fan brace.

FIGS. 12 and 13 illustrate a ceiling fan brace 46 connected to an electrical box 44. Ceiling fan brace 46 includes a pair of engagement members 48 with an outer rod 50 and an inner rod 52 between the engagement members. A box connector 54 may surround a portion of outer rod 50 and connect to the electrical box 44 with bolts or screws 56, thereby positioning the electrical box in a generally downward position to be accessible on a ceiling. Outer rod 50 may include a first end 58 opposite a second end 60, with an engagement member 48 positioned on one of outer rod 50 and inner rod 52 received within the other end of outer rod 50. Further, a second engagement member 48 is then positioned on the free end of inner rod 52 such that the distance between the two engagement members may be increased or decreased by relative movement between the inner and outer rods. Inner rod 52 and outer rod 50 may include All Thread or other suitable connection methods, including a multi-lead screw which provides for increase movement with less rotations than all thread or other standard thread. It has been found that by incorporating a multi-threaded engagement between the inner and outer rods that the installer can install the ceiling fan brace almost six times faster.

Still further, it is within the spirit and scope of the present disclosure to provide a clutch or other torque limiting device whereby when a user continues to expand the inner and outer rods until the engagement members 48 contact studs and begin to provide resistive forces. A torque-limiting clutch (not specifically shown) will limit the expanding force to a certain lb-ft of torque so that the inner and outer rods, the ceiling brace, and the studs are not damaged during installation.

FIG. 13 illustrates a view of an end cap 62 having a recessed portion 64 and a lip 66. Engagement member 48 includes an aperture 68 arranged to fit over lip 66 and aligned within recessed portion 64. Deflection tabs 70 may then be forced inwards with a hammer, punch, or other suitable tool to position at least a portion of reach deflection tab within recessed portion 64 and behind lip 66 to advantageously prevent engagement member 48 from being pulled off of the inner or outer rod respectively. While end cap 62 is shown as a separate portion, it is within the spirit and scope of the present disclosure to provide recessed portion 64 and lip 66 directly on the inner and outer rods.

Engagement member 48 also includes two sets of teeth, first teeth 72 and second teeth 74. First teeth 72 each include an angled hook portion 76 to provide additional penetration into the wood or other suitable mounting surface. Second teeth 74 are generally straight and contact the mounting surface or stud after the first teeth have already begun to penetrate into the stud. Advantageously, this arrangement allows for greater penetration into the stud in both a rotational direction and a lateral direction. Still further, the second teeth may provide additional feedback to the user for the toque-limiting clutch. Accordingly, it is seen that the engagement members and the ceiling fan brace together provide a stronger and more efficient mounting method for an electrical box which is capable of supporting a ceiling fan or light fixture.

Figure 14:
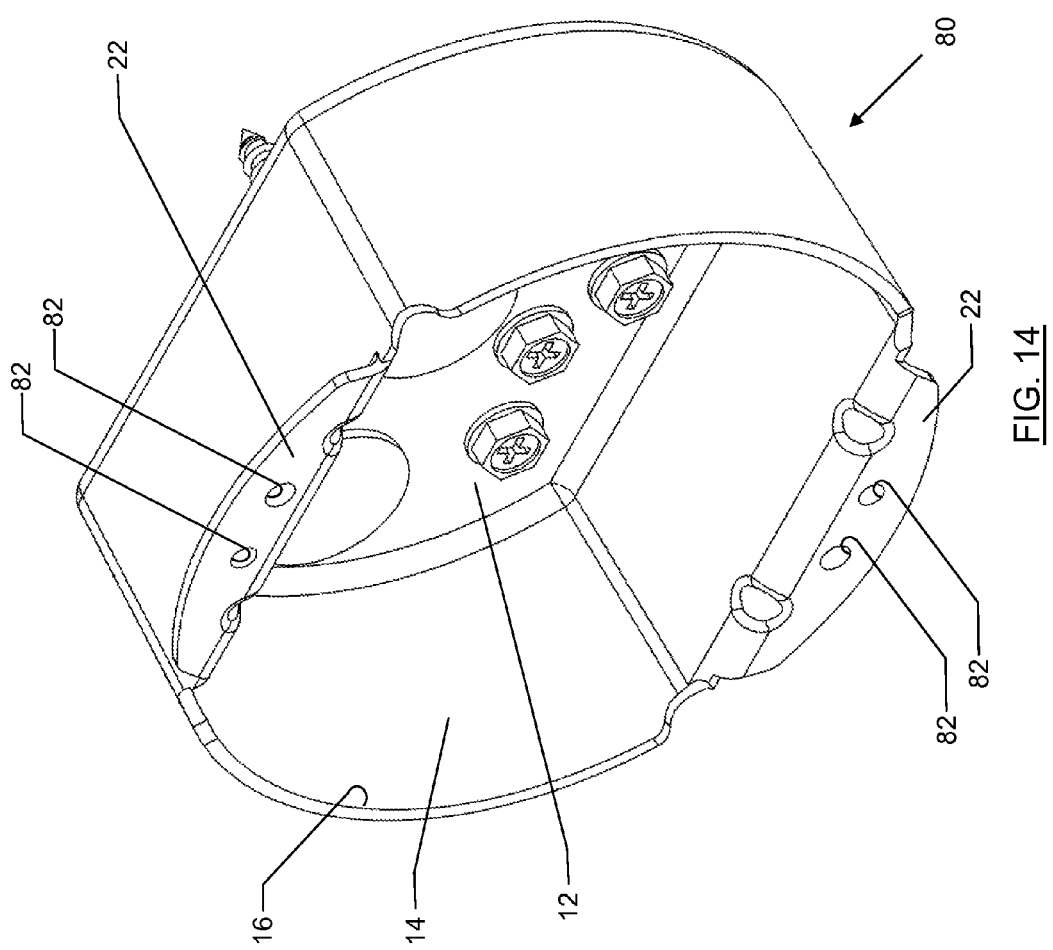
FIG. 14 is a perspective view of a third aspect ceiling fan box.
Figure 15:
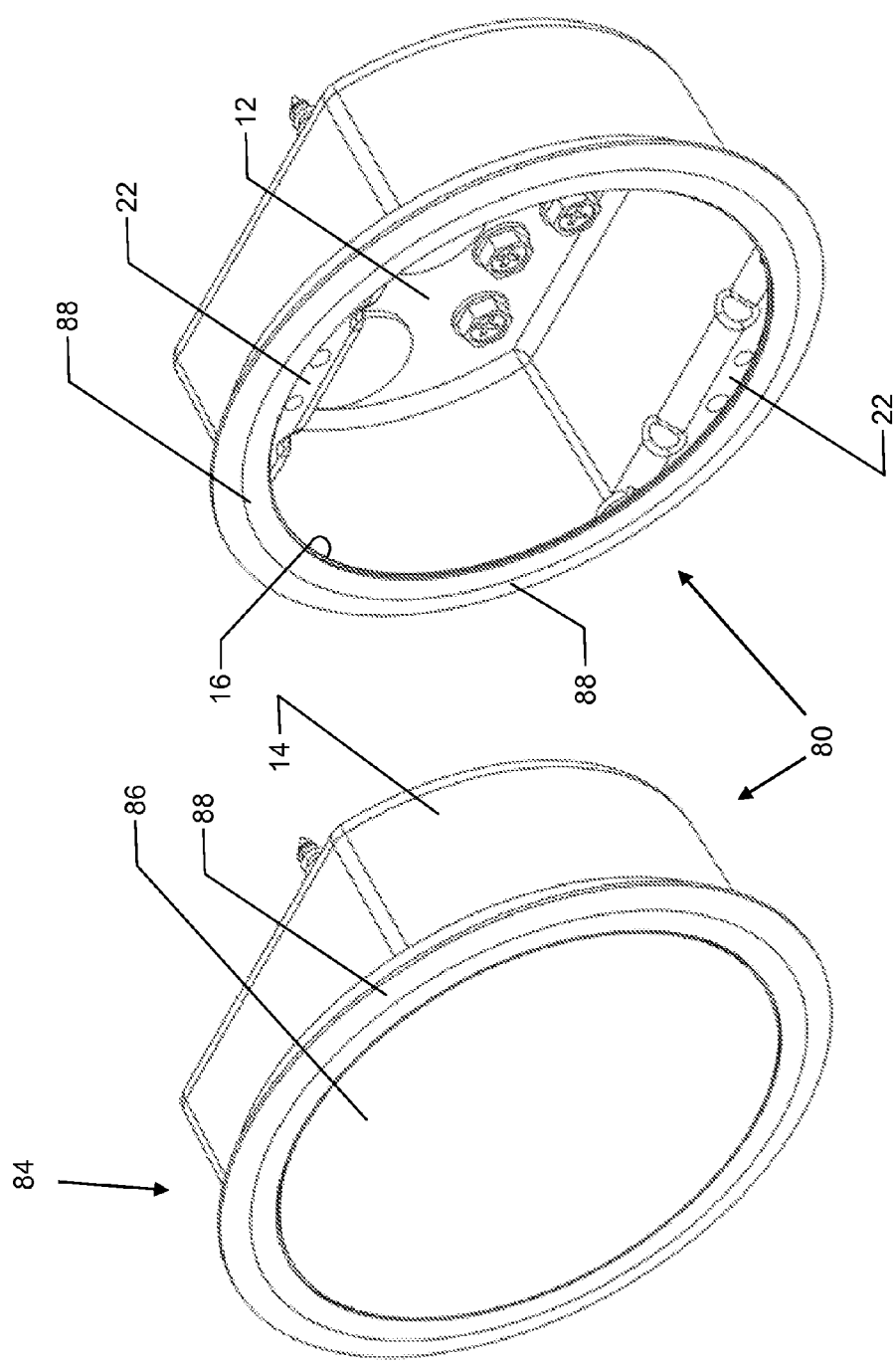
FIG. 15 is a perspective view of the third aspect ceiling fan box with a gasket seal.
Figure 16:
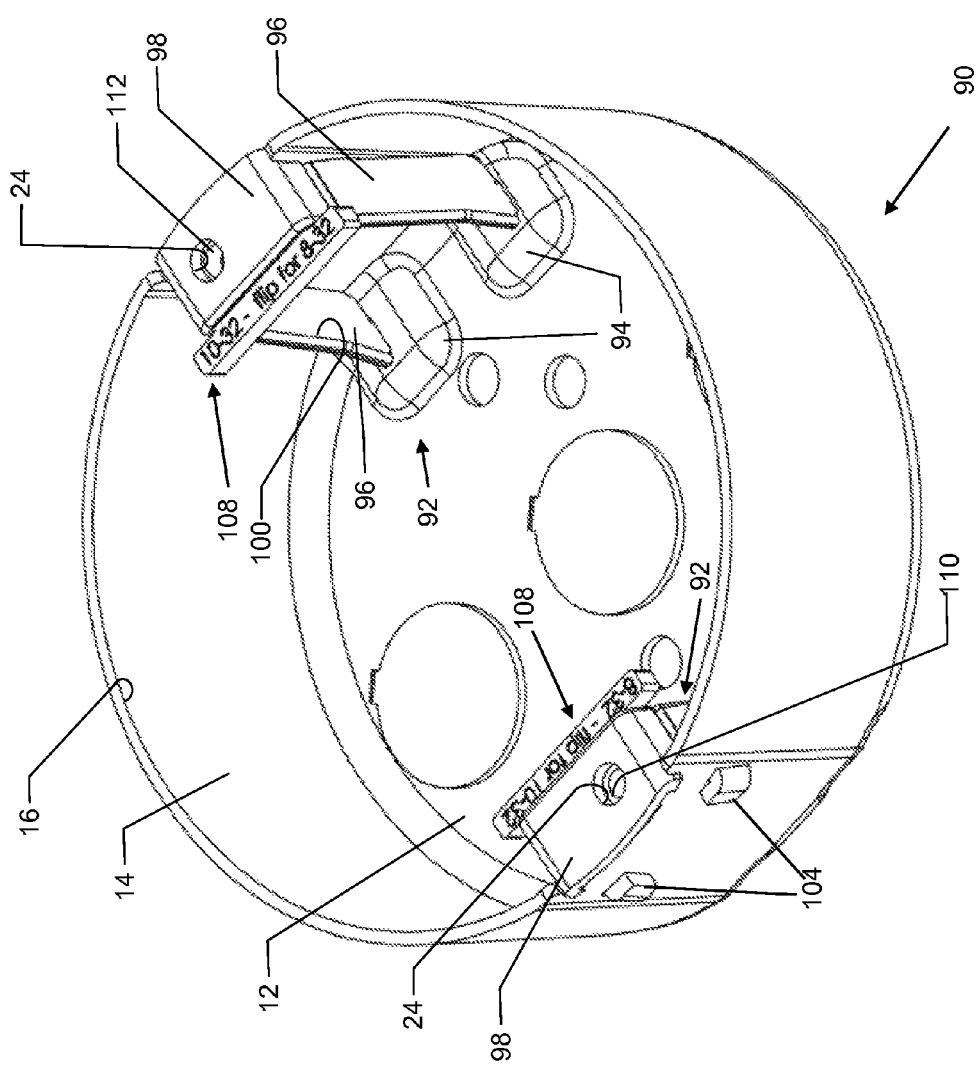
FIG. 16 is a perspective view of a fourth aspect ceiling fan box.
Figure 20:
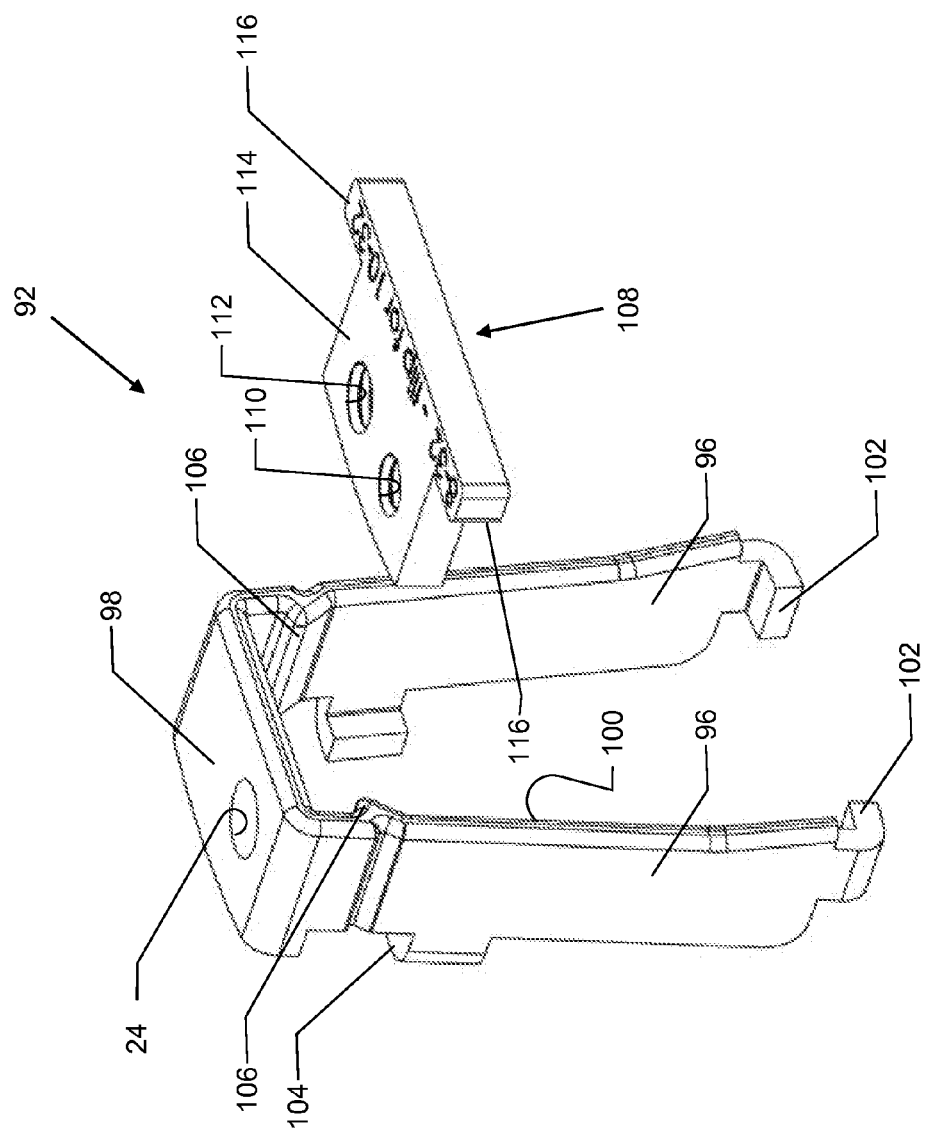
FIG. 20 is a perspective view of a mounting tab of the fourth aspect ceiling fan box.
Figure 26:
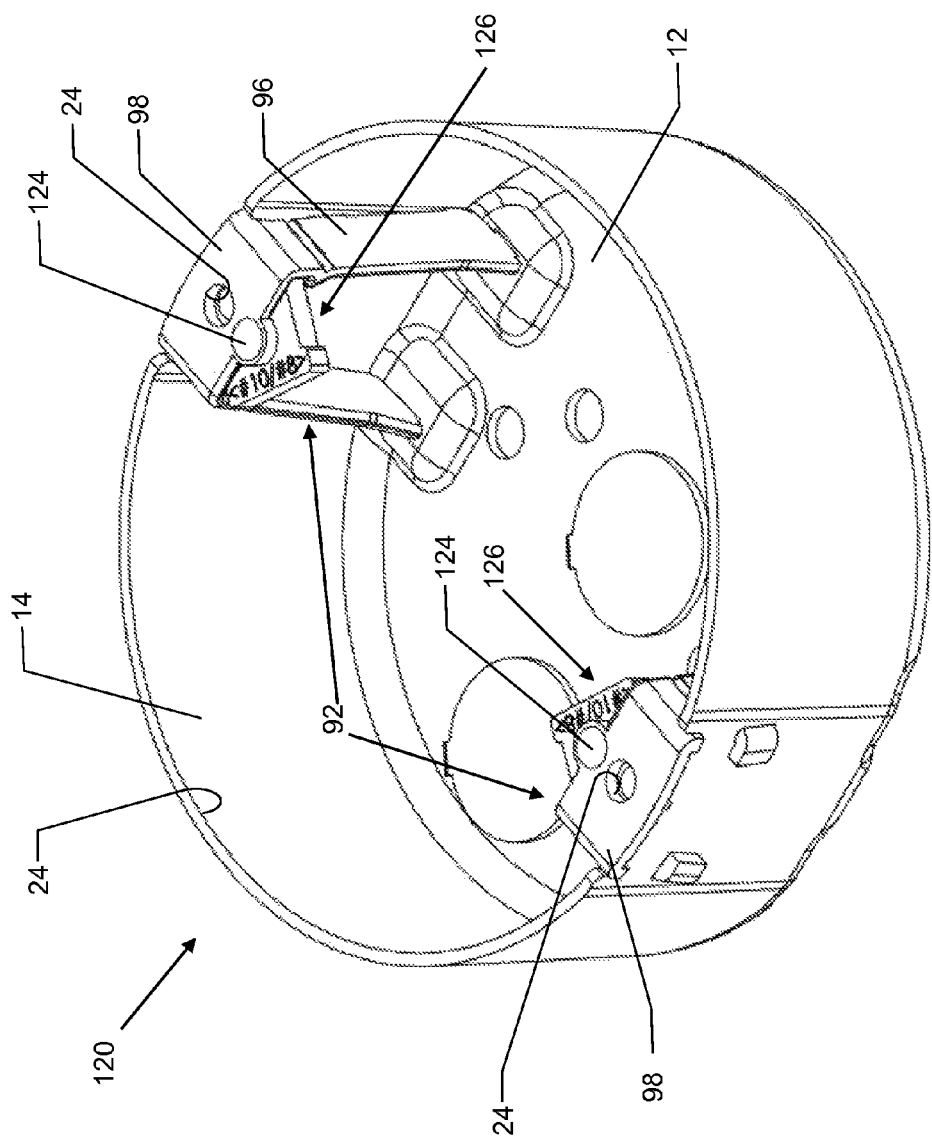
FIG. 26 is a perspective view of a fifth aspect ceiling fan box.
Figure 30:
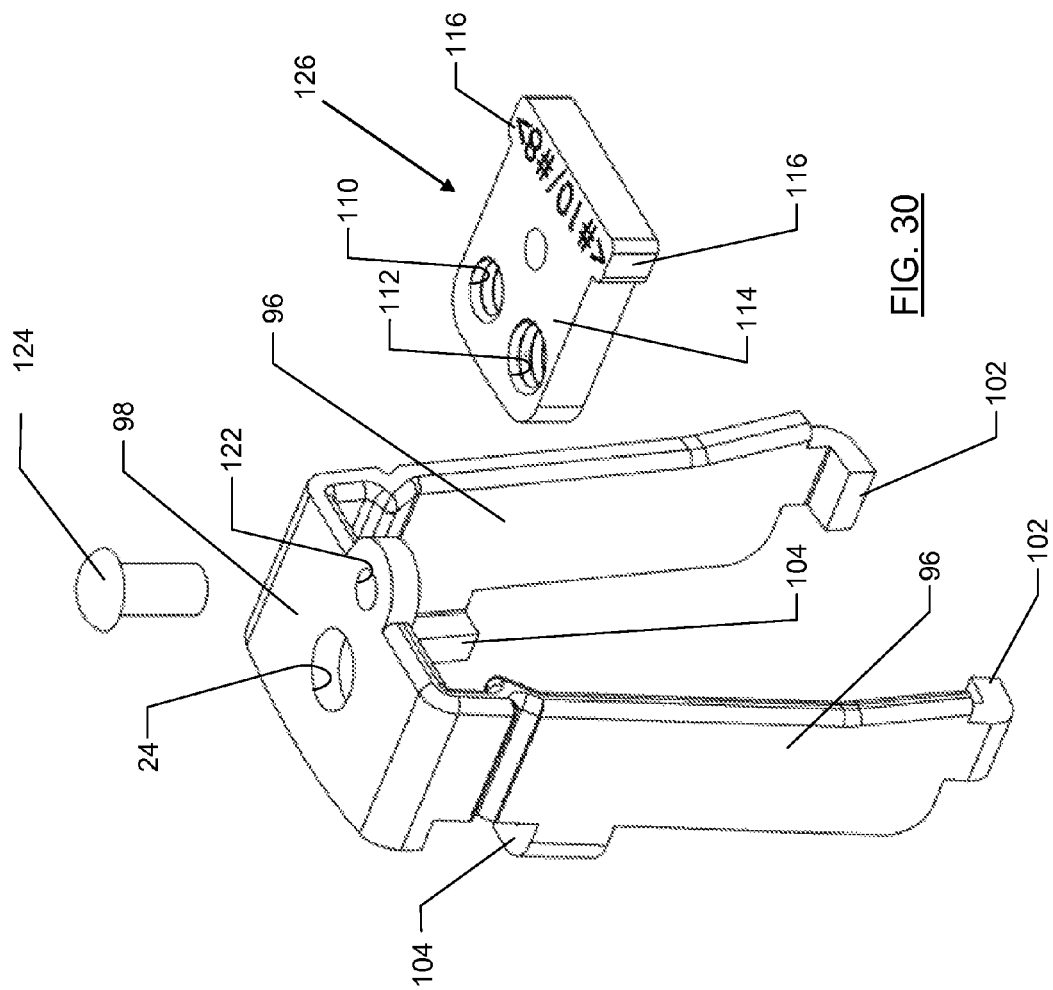
FIG. 30 is a perspective view of a mounting tab of the fifth aspect ceiling fan box.

FIGS. 14 and 15 illustrate a third aspect electrical box 80 similar to the previously described electrical boxes. One major difference is in mounting flanges 22 which extend away from cavity 16, but instead of only a single mounting hole 24 include at least two mounting holes 82 in each flange. In this arrangement, each of the mounting holes 82 in a particular mounting flange 22 have different thread pitches or thread diameters to accommodate different screws or bolts. For example, the opposite mounting holes on mounting flanges 22 are preferably the same thread diameter and thread pitch so that a light fixture or ceiling fan may be mounted to the electrical box.

FIG. 15 provides an advantageous feature in gasket 84 preferably positioned at a bottom portion of electrical box 80 and arranged to prevent debris or paint from entering cavity 16 of the electrical box. Further, gasket 84 may include an inner portion 86 and an outer portion 88, with the inner portion 86 being removable after painting or installation, thereby leaving outer portion 88. Outer portion 88 may contact the bottom of side wall 14 and mounting flanges 22 to provide a perimeter seal and prevent conditioned air from entering the box or non-conditioned air from entering the building through the electrical box. Specifically, the outer portion 88 may contact the drywall or interior room surrounding wall and the ceiling fan or light fixture to provide a seal.

FIGS. 16 through 25 illustrate various views of a fourth aspect electrical box 90 which shares some similar components as the previously discussed electrical boxes. One difference is the inclusion of mounting flanges 92 preferably positioned 180 degrees from each other and partially within cavity 16 in one aspect, although the mounting flanges 92 may also be positioned outside of the cavity 16 without departing from the spirit and scope of the present disclosure. Further, top wall 12 may include protrusions 94 arranged to receive mounting flange walls 96. Mounting flange walls 96 extend downwards and may end in a bottom wall 98 near the bottom of cavity 16 and includes mounting hole 24 therein. Each of the two mounting flange walls 96 together with the portion of side wall 14 there between defines an interior portion 100 which may be sealed off with a guard or other suitable blocking mechanism.

Mounting flange 92 is secured to electrical box 90 with top tabs 102 extending through top wall 12 and side tabs 104 extending through side wall 14. Both tabs 102 and 104 may then be bent or biased once installed to secure the mounting flange 92 to the electrical box. One additional feature worth noting is a mounting ledge 106 positioned on each mounting flange wall 96 or extending between two mounting flange walls. Mounting ledge 106 may also be formed in a guard. Regardless of the form, mounting ledge 106 provides alignment and support for a mounting fastener 108 as will be discussed below.

Mounting fastener 108 is functionally similar to previously described mounting fasteners, except that it may be flipped 180 degrees to provide access to a threaded opening of a different diameter and/or thread. Specifically, mounting fastener 108 includes a first threaded opening 110 and a second threaded opening 112 in body 114. The threaded openings 110, 112 may be positioned offset from the center of body 114 so that mounting hole 24 is also off-center in bottom wall 98 and mounting fastener 108 may be flipped 180 degrees to provide a different thread diameter and/or thread pitch. Specifically, each mounting fastener 108 includes at least two threaded openings, where one threaded opening is aligned with mounting hole 24 in a first orientation of mounting fastener 108 and the other threaded opening is aligned with mounting hole 24 in a second orientation of fastener 108.

Referring to FIGS. 21 through 25 where various views of mounting fastener 108 are shown, body 114 also includes a pair of alignment tabs 116 which each extend from a side of body 114 and provide a limit to the distance mounting fastener 108 can be inserted into interior portion 100. Specifically, alignment tabs 116 contact mounting flange walls 96 which corresponds with alignment of the threaded openings and mounting hole 24. Further, mounting fasteners 108 are shaped and sized to fit within interior portion 108 between bottom wall 98 and mounting ledges 106.

In operation, the user selects the appropriate mounting fastener 108 and then orients the mounting fastener within interior portion 100 so that the appropriate threaded opening 110 or 112 is accessible through mounting hole 24. In this arrangement, a guard may then be installed, or the fixture or ceiling fan may be installed after the electrical box is installed. Advantageously, the mounting fastener 108 installation may occur before or after the electrical box is mounted within the ceiling or wall. Thus it is seen that a user may selectively decide which threaded mounting fastener to incorporate within the electrical box.

FIGS. 26 through 35 illustrate various view of a fifth aspect electrical box 120 having components similar to the above-referenced electrical boxes. Electrical box 120 includes a mounting flange 92 similar to the fourth aspect electrical box with a mounting hole 24 which may be centrally positioned within bottom wall 98 or in an offset position within bottom wall 98. Bottom wall 98 may also include an aperture 122 for receiving a fastener 124 therein. Specifically, a mounting fastener 126 includes a hole 128 for receiving fastener 124 to secure the mounting fastener to the mounting flange 92. Mounting fastener 126 and mounting flange 92 function similar to the fourth aspect electrical box in that the mounting fastener provides two different threaded openings in a single body.

Mounting fastener 126 is rotatably mounted to the mounting flange such that when the mounting fastener is rotated in a first direction, a first threaded opening is accessible through the mounting hole 24. Similarly, when the mounting fastener is rotated in a second direction, a second threaded opening is accessible through the mounting hole 24. Since the first and second threaded openings different, the user may selectively determine which of the threaded openings to utilize. Alignment tabs 116 may each contact mounting flange legs 96 in a position where the first or second threaded opening are accessible through mounting holes 24 to assist with alignment. In a preferred orientation, the mounting fastener rotates about an axis generally perpendicular to a plane defined by the top wall 12.

Figure 36:
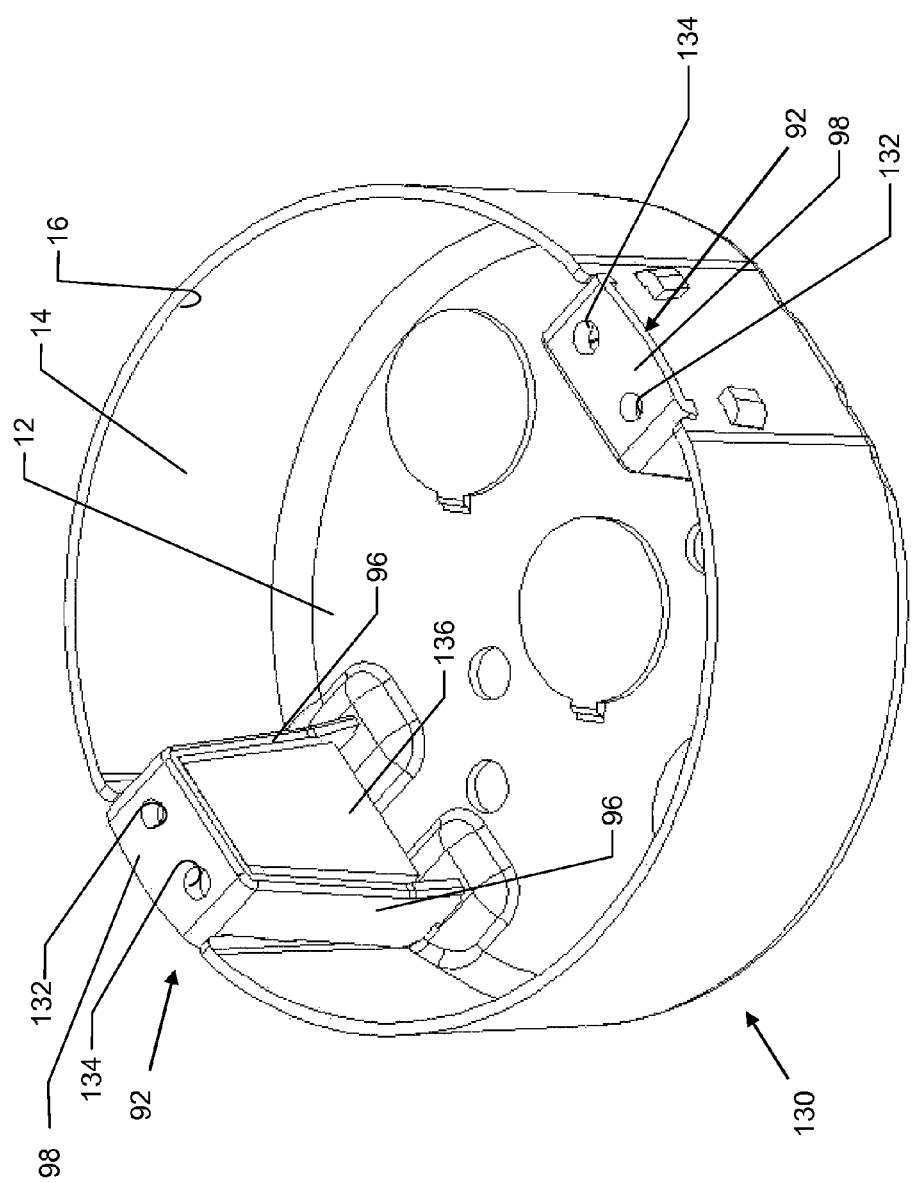
FIG. 36 is a perspective view of a sixth aspect ceiling fan box.
Figure 37:
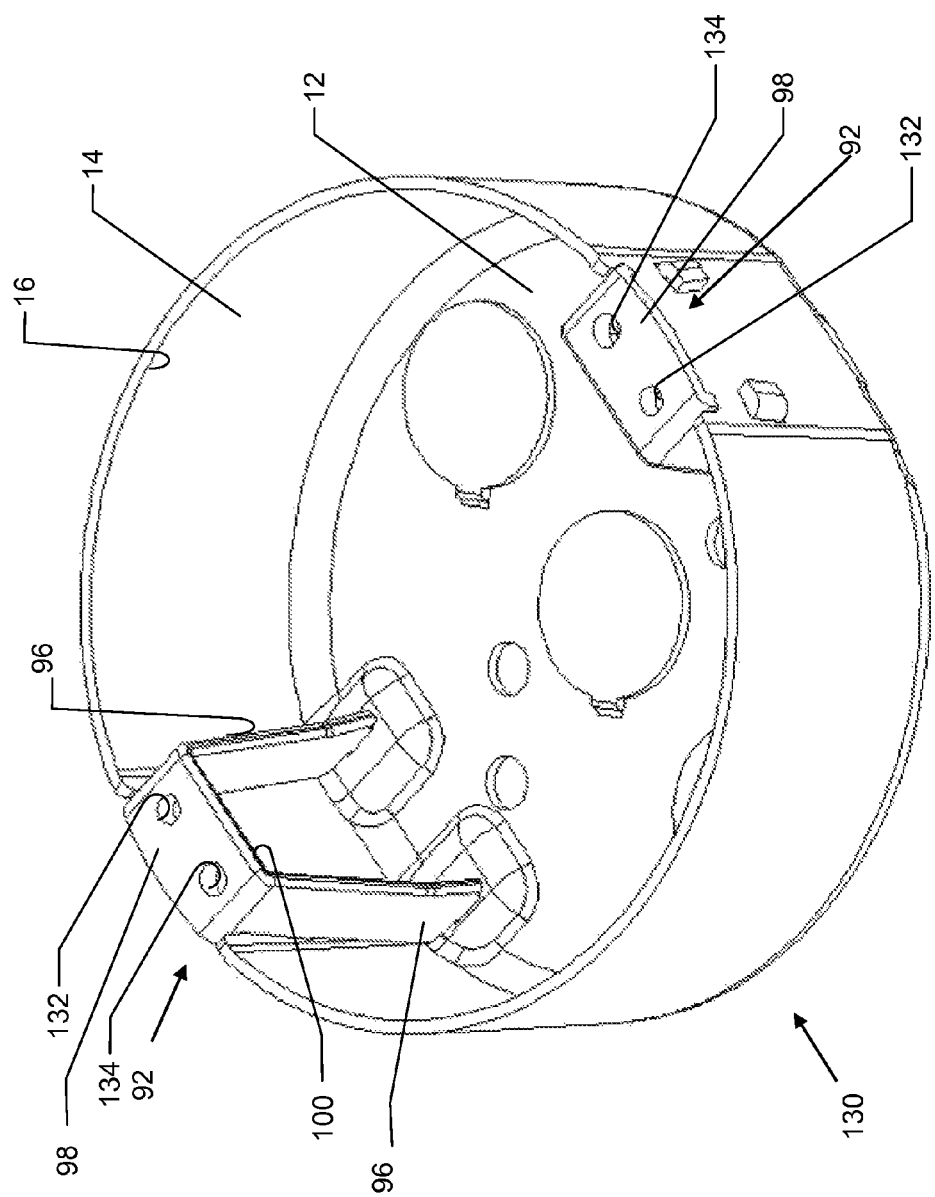
FIG. 37 is a perspective view of the sixth aspect ceiling fan box with a guard removed.

FIGS. 36 and 37 illustrate a sixth aspect electrical box 130 with mounting flanges 92 having mounting flange walls 96 and bottom wall 98 defining interior portion 100. In each of bottom walls 98, there may be a first threaded opening 132 and a second threaded opening 134, which may be the same or different diameters and/or threads. Advantageously, a guard 136 may be releasably secured to cover interior portion 100.

Figure 38:
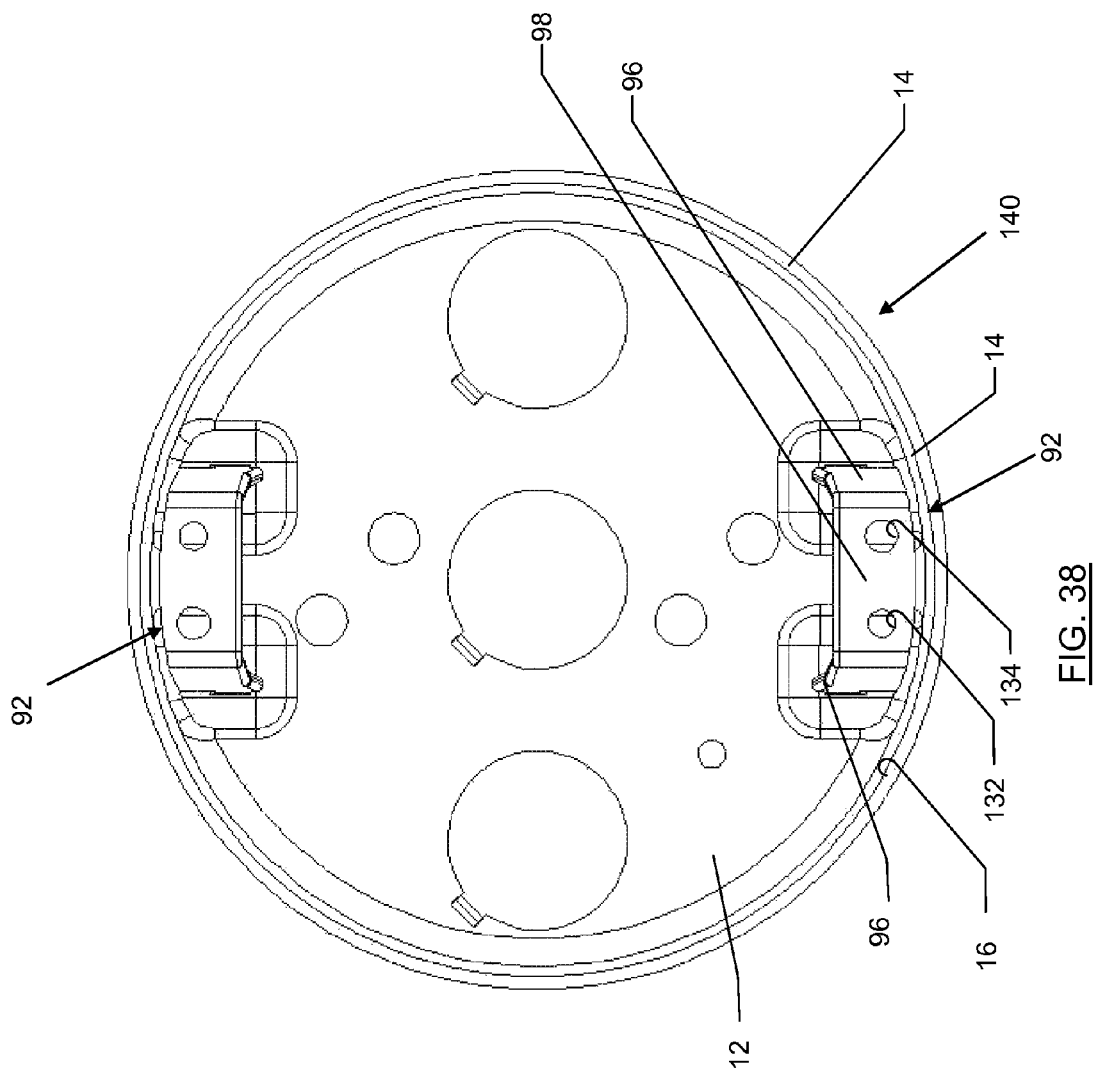
FIG. 38 is a bottom view of a seventh aspect ceiling fan box.

FIG. 38 illustrates a seventh aspect electrical box 140 having mounting flanges 92 similar to those previously disclosed, but omitting a direct connection to side wall 14. In this aspect, mounting flange walls 96 are secured to top wall 12 only. The remainder of the components remain similar or the same.

Figure 39:
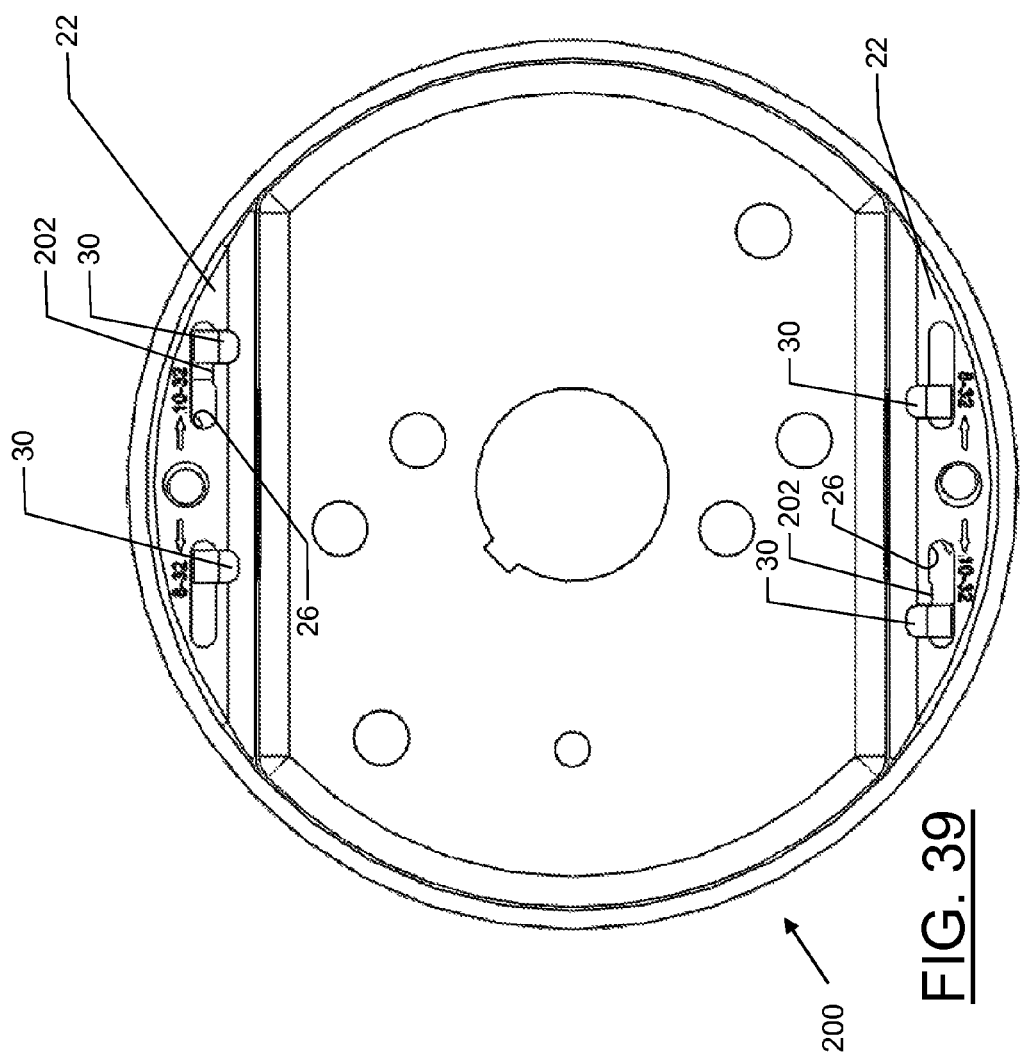
FIG. 39 is a bottom view of an eighth aspect ceiling fan box with detents to at least partially limit movement of the mounting fastener.
Figure 40:
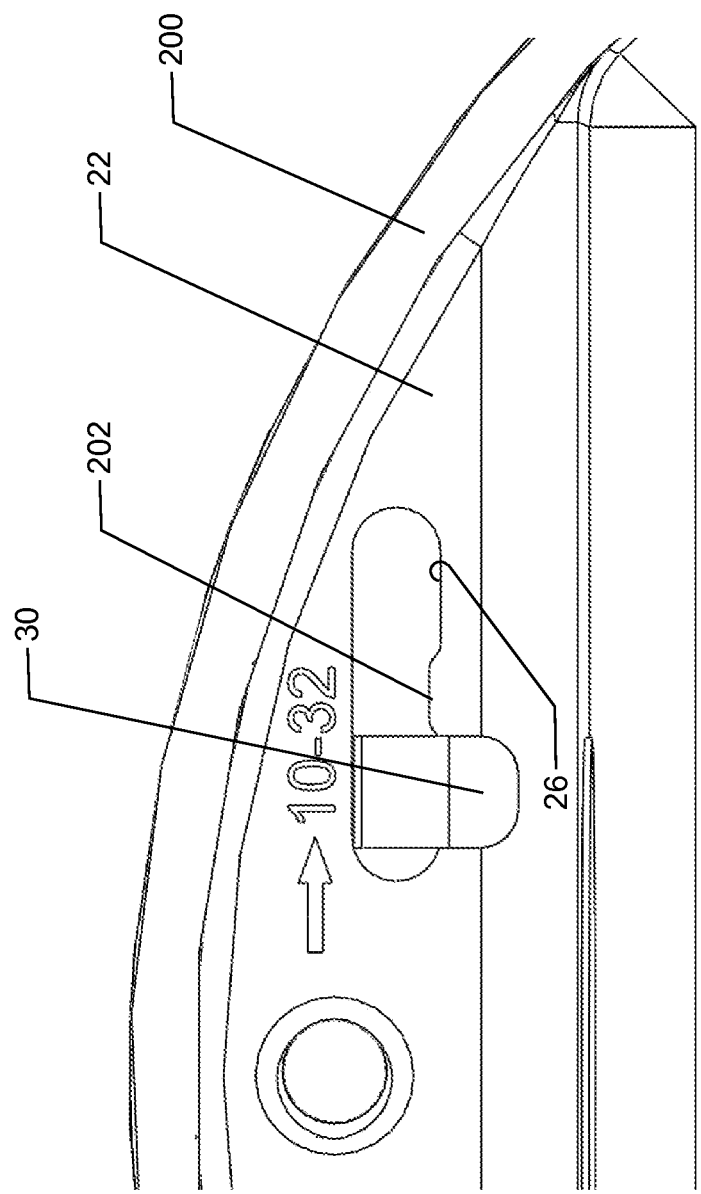
FIG. 40 is an enlarged view of ceiling fan box with detents of FIG. 39.

FIGS. 39 and 40 illustrate an eighth aspect electrical box 200 similar to previously described aspects and implementations. The only difference is the inclusion of detents 202 extending inward into slots 26 on mounting flanges 22. When sliding tabs 30 are moved left or right within slots 26, additional pressure must be applied to overcome the resistance caused by detents 202. On one side of detents 202 the sliding tab provides a mounting fastener of a first size or thread pitch and on the other side of detents 202 the sliding tab provides a mounting fastener of a second size or thread pitch. In operation, slots 26 can be easily moved beyond detents 202 so that the operator can select the appropriate threaded opening 32 or 34 but the slots will not move beyond the detents once the user has selected the appropriate threaded opening (8-32 or 10-32 in the exemplary FIGS. 39 and 40). Thus, it is seen that the detents reduce the need for a frictional engagement between slots 26 and sliding tabs 30 will prevent the incorrect threaded opening from being inadvertently used.

Figure 41:
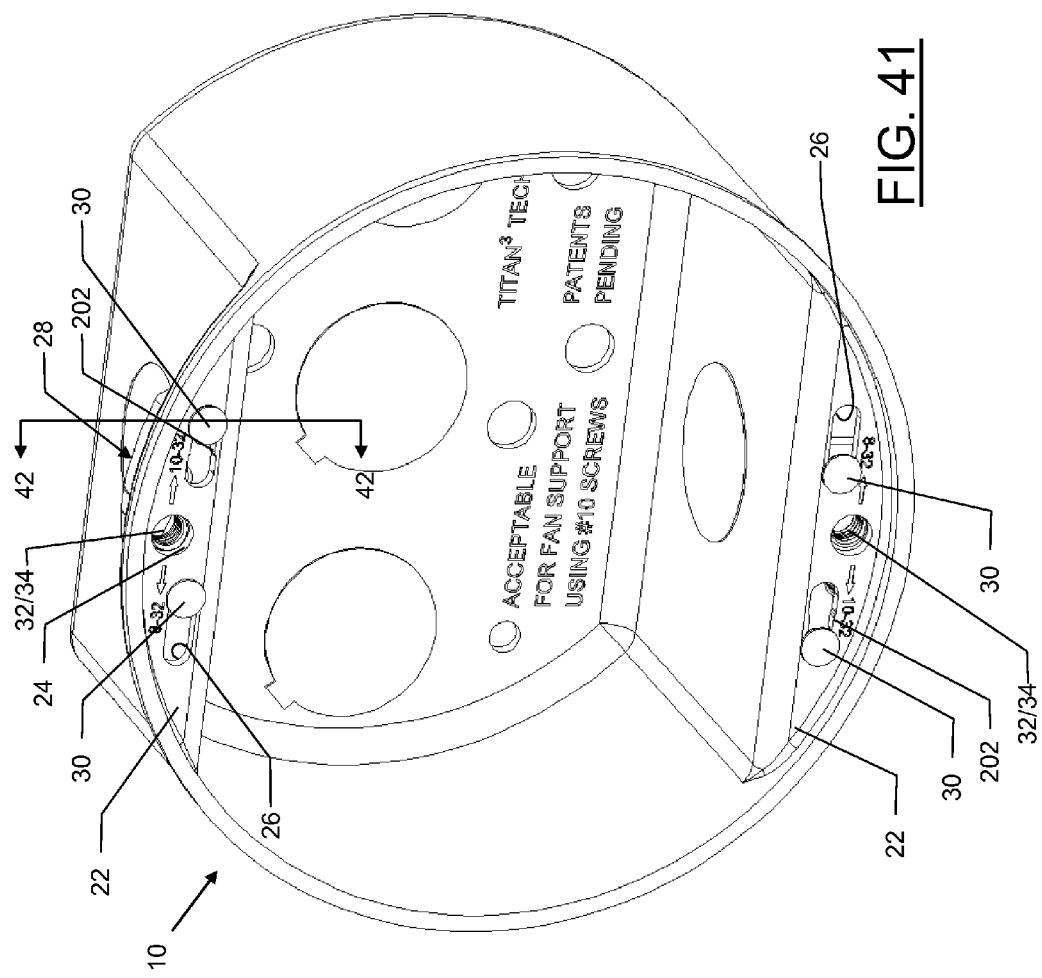
FIG. 41 is a perspective view of a ninth aspect ceiling fan box with detents and riveted sliding tab.
Figure 42:
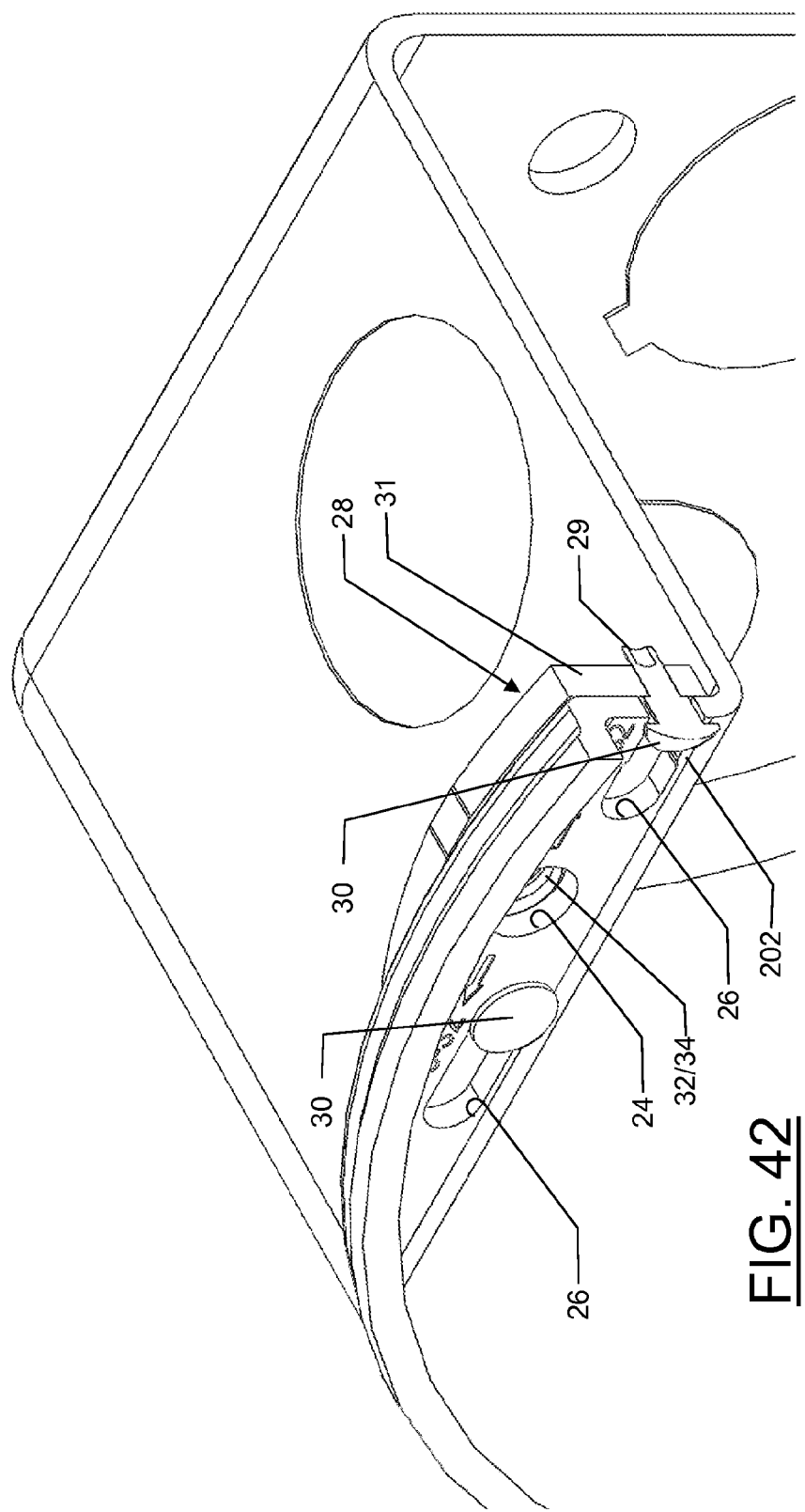
FIG. 42 is an enlarged section view of the ceiling fan box taken generally about line 42-42 in FIG. 41.
Figure 43:
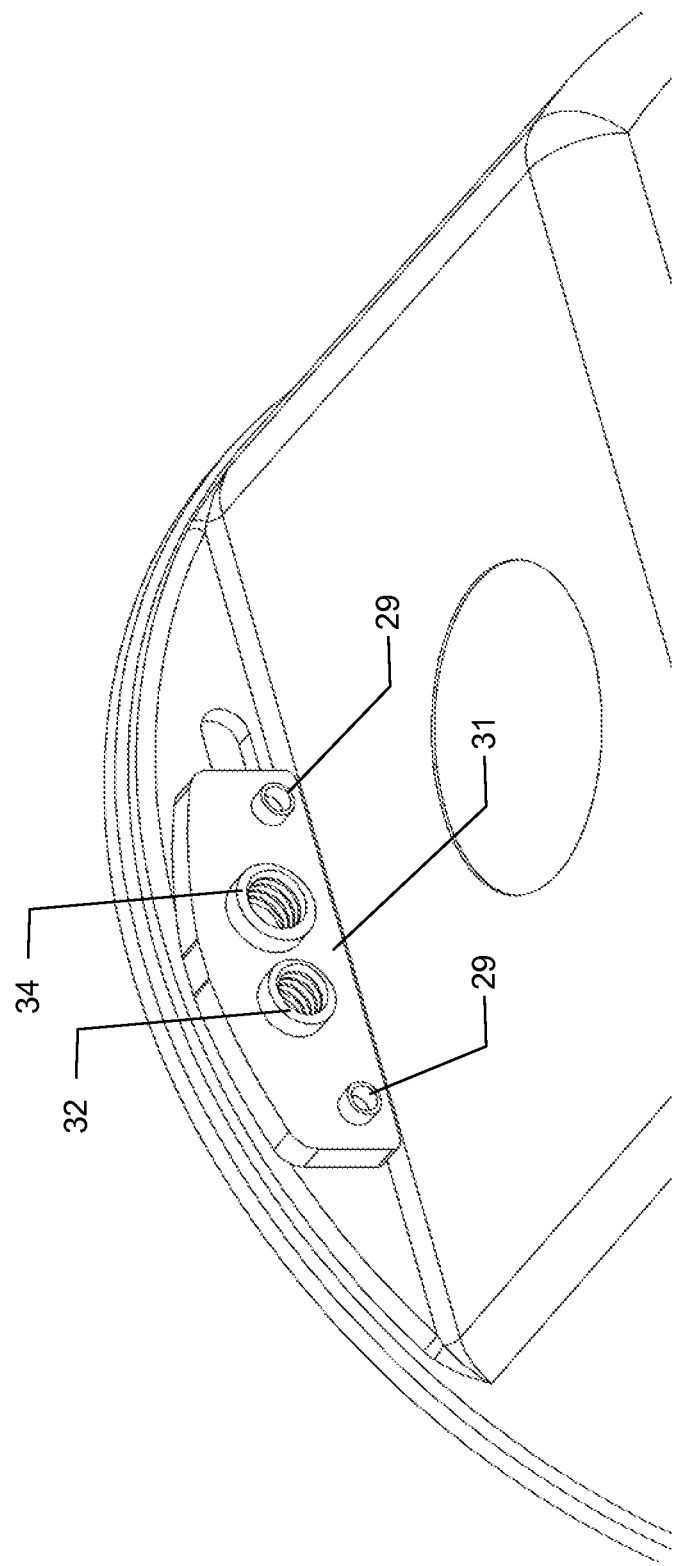
FIG. 43 is a rear enlarged section view of the ceiling fan box taken generally about line 42-42 in FIG. 41.

FIGS. 41 through 43 illustrate additional views of a ninth aspect ceiling fan box 10 with mounting flanges 22 similar to previously disclosed aspects and implementations. Mounting flanges 22 each include mounting hole 24 and mounting slots 26. Mounting fastener 28 includes a sliding tab 30 with sliding tab shaft 29 extending through slots 26. Sliding tab shaft 29 may be riveted to mounting fastener body 31 through riveting, welding, threaded engagement, adhesive, cementing, or any other permanent or non-permanent connection. Again similar to previous aspects, threaded openings 32 and 34 are selectively aligned with mounting hole 24 to secure a fixture or ceiling fan to the electrical box. Detents 202 may again be utilized to prevent the sliding tab from incorrectly moving to the wrong threaded opening 32 or 34. Advantageously, mounting fastener body 31 and sliding tab shaft 29 may be formed separately and later combined together for easier manufacturing. Sliding tab shaft 29 may also be square or rounded as appropriate. Thus it is seen that the rounded sliding tab 30 formed with sliding tab shaft 29 and mounting fastener body 31 is easier to manufacture and manipulate by the end user due to the rounded mushroom top and shaft in conjunction with detents 202. Nevertheless, it is within the spirit and scope of the present disclosure to provide any number of features disclosed herein in any suitable combinations.

Figure 44:
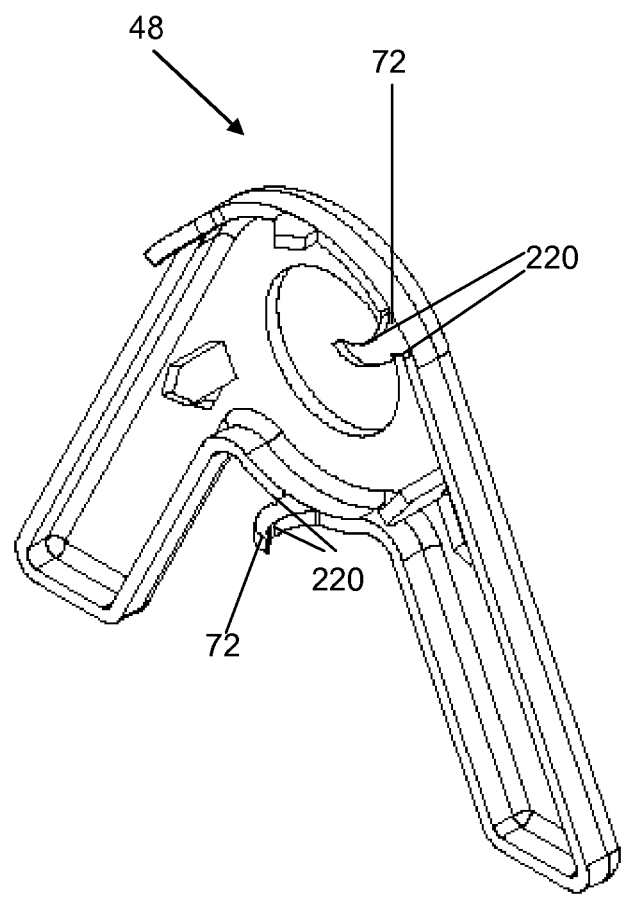
FIG. 44 is a perspective view of an alternative implementation of a mounting component.
Figure 45:
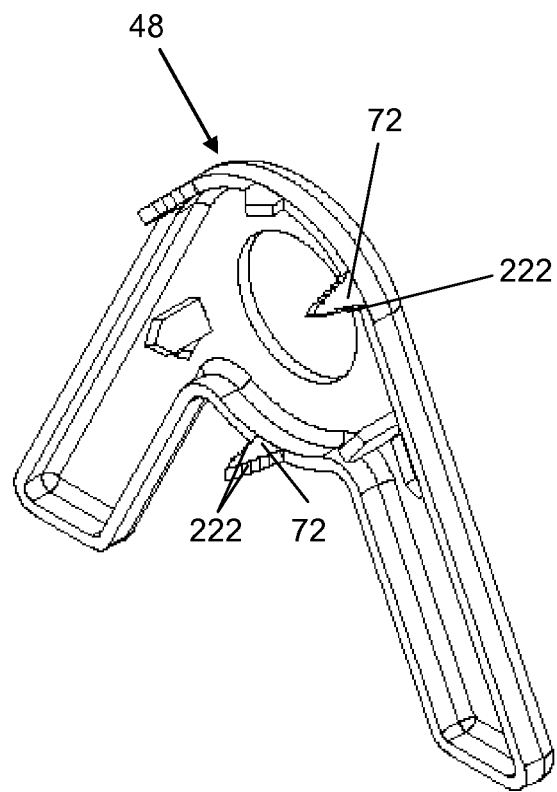
FIG. 45 is a perspective view of another alternative implementation of a mounting component.
Figure 46:
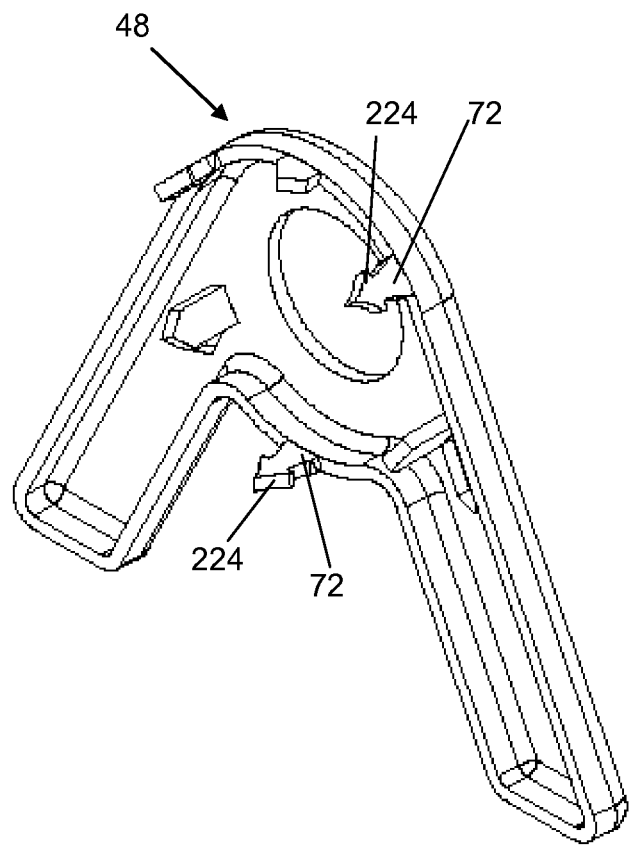
FIG. 46 is a perspective view of yet another alternative implementation of a mounting component.

FIGS. 44 through 46 illustrate various implementations of mounting components 48. FIG. 44 illustrates first teeth 72 similar to those disclosed in FIG. 13 with additional serrated portions 220 on both the interior and exterior of the first teeth 72. Advantageously, these additional serrated portions 220 assist to penetrate the joist during installation while also resisting withdrawal from the joist after installation. FIG. 45 illustrates first teeth 72 similar to second teeth 74 but including serrated portions 222 extending along the full length of first teeth 72. Although the disclosed implementation in FIG. 45 provides serrated portions 222 extending the full length of the first teeth 72, it should be apparent that any number of serrated portions of varying depth and orientation may be utilized to assist with penetrating the joist and limiting withdrawal from the joist thereafter. FIG. 46 illustrates first teeth 72 similar to second teeth 74 but includes arrowheads 224 on a tip of the first teeth 72. Advantageously, once arrowheads 224 penetrate the joist, they are more difficult to remove due to the joist at least partially swelling around the arrowhead 224. Accordingly, it is seen that a number of variations in serrated, arrowheads, or hooked teeth may incorporated to further bolster the performance of the ceiling fan box.

As can be seen the various aspects and implementations of the present disclosure provide a number of user friendly electrical boxes and particularly for mounting ceiling fans whether a ceiling fan box brace is needed or not. Some advantages of certain aspects include only a single mounting hole with a movable, slidable, flipable, or rotatable fastener element for easier installation. Further, the ceiling fan brace provides easier and faster installation with a torque-limiting clutch, a multi lead threaded members, and engagement members with multiple teeth orientations.

It will be understood that implementations are not limited to the specific components disclosed herein, as virtually any components consistent with the intended operation of a method and/or system implementation for an electrical box may be utilized. Components may comprise any shape, size, style, type, model, version, class, grade, measurement, concentration, material, weight, quantity, and/or the like consistent with the intended operation of a method and/or system implementation for an electrical box.

The concepts disclosed herein are not limited to the specific implementations shown herein. For example, it is specifically contemplated that the components included in a particular implementation of an electrical box may be formed of any of many different types of materials or combinations that can readily be formed into shaped objects and that are consistent with the intended operation of an electrical box. For example, the components may be formed of: rubbers (synthetic and/or natural) and/or other like materials; polymers and/or other like materials; plastics, and/or other like materials; composites and/or other like materials; metals and/or other like materials; alloys and/or other like materials; and/or any combination of the foregoing.

Furthermore, embodiments of the electrical box may be manufactured separately and then assembled together, or any or all of the components may be manufactured simultaneously and integrally joined with one another. Manufacture of these components separately or simultaneously may involve extrusion, pultrusion, vacuum forming, injection molding, blow molding, resin transfer molding, casting, forging, cold rolling, milling, drilling, reaming, turning, grinding, stamping, cutting, bending, welding, soldering, hardening, riveting, punching, plating, and/or the like. If any of the components are manufactured separately, they may then be coupled or removably coupled with one another in any manner, such as with adhesive, a weld, a fastener, any combination thereof, and/or the like for example, depending on, among other considerations, the particular material(s) forming the components.

In places where the description above refers to particular implementations of an electrical box, it should be readily apparent that a number of modifications may be made without departing from the spirit thereof and that these implementations may be applied to other electrical boxes. The accompanying claims are intended to cover such modifications as would fall within the true spirit and scope of the disclosure set forth in this document. The presently disclosed implementations are, therefore, to be considered in all respects as illustrative and not restrictive, the scope of the disclosure being indicated by the appended claims rather than the foregoing description. All changes that come within the meaning of and range of equivalency of the claims are intended to be embraced therein.

We claim:
1. An electrical box comprising:
a top wall;
a side wall connected to the top wall;
a cavity formed by the top wall and the side wall;
at least one mounting flange on the side wall having a mounting hole therein;
at least one mounting fastener in communication with the at least one mounting flange;
wherein the mounting fastener is slidably engaged with the at least one mounting flange; and,
wherein the mounting fastener further comprises a first threaded opening and a second threaded opening and the first threaded opening is a different diameter or thread pitch than the second threaded opening.

2. The electrical box of claim 1 wherein the at least on mounting flange further comprises two mounting flanges positioned 180 degrees from each other with at least one mounting fastener in communication with each of the two mounting flanges.

3. The electrical box of claim 1 wherein the at least one mounting flange is external to the cavity.

4. The electrical box of claim 1 wherein the at least one mounting flange is connected to the sidewall.

5. The electrical box of claim 1 wherein the mounting fastener further comprises at least one sliding tab.

6. The electrical box of claim 5 wherein the at least one sliding tab extends through the at least one mounting flange.

7. The electrical box of claim 1 further comprising a secondary mounting flange positioned below the at least one mounting flange.

8. The electrical box of claim 1 wherein the at least one mounting flange extends away from the cavity in a direction generally parallel to the top wall.

9. The electrical box of claim 1 wherein the mounting flange further comprises at least one detent and the detent limits movement of the mounting fastener.

10. The electrical box of claim 1 wherein the mounting fastener further comprises a riveted connection between a sliding tab shaft and a mounting fastener body.

11. A ceiling fan box brace comprising:
the electrical box of claim 1;
an outer rod having a first end and a second end and the electrical box being connectable to the rod;
an inner rod being movable within the outer rod for increasing or decreasing an overall length of a combined inner and outer rod;
at least one engagement member positioned on one of the outer rod or the inner rod and
having a first mounting tooth and a second mounting tooth.

12. The electrical box of claim 11 wherein the first mounting tooth engages a ceiling brace before the second mounting tooth.

13. The electrical box of claim 11 wherein the first mounting tooth comprises an angled hook portion and the second mounting tooth is generally straight.

14. An electrical box comprising:
a top wall;
a side wall connected to the top wall;
a cavity formed by the top wall and the side wall;
at least one mounting flange positioned at least partially within the cavity and having no more than one mounting hole;
at least one mounting fastener in communication with the at least one mounting flange and positionable in alignment with the mounting hole;
wherein the at least one mounting fastener is slidably engaged with the at least one mounting flange;
wherein the mounting fastener further comprises a first threaded opening and a second threaded opening, and
wherein the first threaded opening is accessible through the at least one mounting flange when the mounting fastener is in a first position and the second threaded opening is accessible through the at least one mounting flange when the mounting fastener is in a second position.

15. The electrical box of claim 14 wherein the at least one mounting fastener is rotatably mounted to the at least one mounting flange.

16. The electrical box of claim 15 wherein the at least one mounting fastener rotates about an axis generally perpendicular to a plane of the top wall.

17. The electrical box of claim 14 further comprising a guard preventing access to an interior portion of the mounting flange.

18. An electrical box comprising:
a top wall;
a side wall connected to the top wall;
a cavity formed by the top wall and the side wall;
at least one mounting flange on the side wall having a mounting hole therein;
at least one mounting fastener in communication with the at least one mounting flange;
wherein the mounting fastener is slidably engaged with the at least one mounting flange;
wherein the mounting fastener further comprises a first threaded opening and a second threaded opening, and
wherein the first threaded opening is accessible through the at least one mounting flange when the mounting fastener is in a first position and the second threaded opening is accessible through the at least one mounting flange when the mounting fastener is in a second position.

19. A ceiling fan box brace comprising:
the electrical box of claim 18;
an outer rod having a first end and a second end and the electrical box being connectable to the rod;
an inner rod being movable within the outer rod for increasing or decreasing an overall length of a combined inner and outer rod;
at least one engagement member positioned on one of the outer rod or the inner rod and
having a first mounting tooth and a second mounting tooth.

20. The electrical box of claim 19 wherein the first mounting tooth engages a ceiling brace before the second mounting tooth.

21. The electrical box of claim 19 wherein the first mounting tooth comprises an angled hook portion and the second mounting tooth is generally straight.

* * * * *